United States Patent
Kim et al.

(10) Patent No.: US 9,412,731 B2
(45) Date of Patent: Aug. 9, 2016

(54) SEMICONDUCTOR DEVICE

(71) Applicant: Samsung Electronics Co., Ltd., Suwon-si (KR)

(72) Inventors: Seokhoon Kim, Suwon-si (KR); Bonyoung Koo, Suwon-si (KR); JinBum Kim, Seoul (KR); Chul Kim, Seongnam-si (KR); Kwan Heum Lee, Suwon-si (KR); Byeongchan Lee, Yongin-si (KR); Sujin Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 42 days.

(21) Appl. No.: 14/562,788

(22) Filed: Dec. 8, 2014

(65) Prior Publication Data
US 2015/0287711 A1   Oct. 8, 2015

(30) Foreign Application Priority Data

Apr. 4, 2014   (KR) .......................... 10-2014-0040415

(51) Int. Cl.
| | |
|---|---|
| *H01L 29/78* | (2006.01) |
| *H01L 27/02* | (2006.01) |
| *H01L 29/06* | (2006.01) |
| *H01L 27/088* | (2006.01) |

(52) U.S. Cl.
CPC ........ *H01L 27/0207* (2013.01); *H01L 27/0886* (2013.01); *H01L 29/0649* (2013.01); *H01L 29/7834* (2013.01)

(58) Field of Classification Search
CPC ............ H01L 29/6659; H01L 29/7833; H01L 29/6656; H01L 29/66659; H01L 29/66795; H01L 29/785; H01L 29/4238; H01L 29/0696; H01L 29/665

USPC .................................................. 257/344, 401
See application file for complete search history.

(56) References Cited

U.S. PATENT DOCUMENTS

| | | | |
|---|---|---|---|
| 7,667,271 | B2 | 2/2010 | Yu et al. |
| 8,263,451 | B2 | 9/2012 | Su et al. |
| 8,313,999 | B2 | 11/2012 | Cappellani et al. |
| 8,362,575 | B2 | 1/2013 | Kwok et al. |
| 2011/0147828 | A1 | 6/2011 | Murthy et al. |
| 2011/0210393 | A1 | 9/2011 | Chen et al. |
| 2012/0276695 | A1 | 11/2012 | Cheng et al. |
| 2013/0026539 | A1 | 1/2013 | Tang et al. |
| 2013/0285143 | A1* | 10/2013 | Oh .................. H01L 21/823821 257/347 |
| 2015/0221654 | A1* | 8/2015 | Kim ........................ H01L 27/11 257/77 |

FOREIGN PATENT DOCUMENTS

JP    2010-0171337 A    8/2010

* cited by examiner

*Primary Examiner* — Monica D Harrison
(74) *Attorney, Agent, or Firm* — Muir Patent Law, PLLC

(57) ABSTRACT

Provided is a semiconductor device which includes a substrate including a first region and a second region different from the first region, a first active pattern provided on the substrate in the first region, a second active pattern provided on the substrate in the second region, a first gate structure crossing over the first active pattern and a second gate structure crossing over the second active pattern, first source/drain regions disposed on the first active pattern at opposite sides of the first gate structure, second source/drain regions disposed on the second active pattern at opposite sides of the second gate structure, and auxiliary spacers disposed in the first region to cover a lower portion of each of the first source/drain regions.

20 Claims, 24 Drawing Sheets

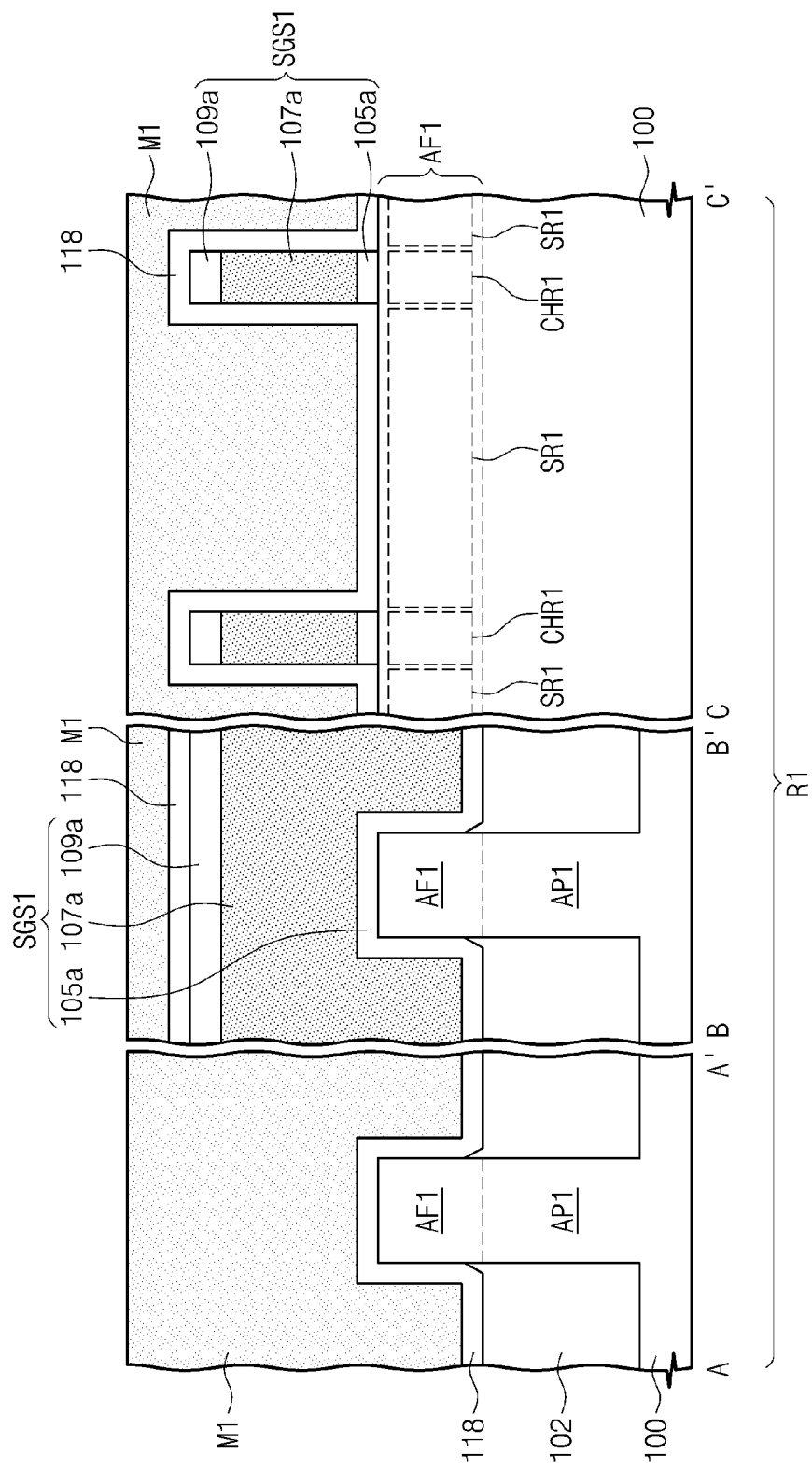

SEMICONDUCTOR DEVICE

CROSS-REFERENCE TO RELATED APPLICATIONS

This US non-provisional patent application claims priority under 35 USC §119 to Korean Patent Application No. 10-2014-0040415, filed on Apr. 4, 2014, the entirety of which is hereby incorporated by reference.

BACKGROUND

Embodiments of the present disclosure relate to semiconductor devices and methods of manufacturing the same and, more particularly, to semiconductor devices including field effect transistors and methods of manufacturing the same.

A semiconductor device may include an integrated circuit comprising, for example, metal-oxide-semiconductor field effect transistors (MOSFETs). As the size and design rule of semiconductor devices continue to become smaller, MOSFETs are increasingly being scaled down. The scale-down of MOSETs may cause characteristics of certain semiconductor devices to be degraded. Accordingly, various research has been conducted to overcome the limitations resulting from high integration of semiconductor devices and to manufacture semiconductor devices with superior performance.

SUMMARY

The present disclosure provides a semiconductor device with improved reliability and a method of manufacturing the same.

A semiconductor device according to some embodiments of the inventive concept may include a substrate including a first region and a second region different from the first region; a first active pattern protruding upwardly from the substrate in the first region and a second active pattern protruding upwardly from the substrate in the second region; first gate structures crossing over the first active pattern and being spaced apart from each other by a first distance and second gate structures crossing over the second active pattern and being spaced apart from each other by a second distance; a first source/drain region disposed on the first active pattern between the first gate structures; and a second source/drain region disposed on the second active pattern between the second gate structures. The first source/drain region may include a lower portion in contact with the first active pattern and an upper portion in contact with the lower portion and spaced apart from the first active pattern. The upper portion may include a first upper portion having a width substantially increasing as it extends away from the substrate and a second upper portion having a width substantially decreasing as it extends away from the substrate. The second source/drain region may include a first portion in contact with the second active pattern and having a width substantially increasing as it extends away from the substrate and a second portion in contact with the first portion, spaced apart from the second active pattern, and having a width substantially decreasing as it extends away from the substrate.

In an exemplary embodiment, the first distance may be greater than the second distance.

In an exemplary embodiment, the first active pattern may extend in a first direction and the first gate structures may extend in a second direction intersecting the first direction. The first source/drain region may have a width in the second direction. The lower portion of the first source/drain region may have a substantially constant width as it extends away from the substrate in a third direction intersecting both the first direction and the second direction.

In an exemplary embodiment, the first active pattern may extend in a first direction and the first gate structures may extend in a second direction intersecting the first direction. The first source/drain region may have a width in the second direction. The lower portion of the first source/drain region may have a width substantially decreasing as it extends away from the substrate in a third direction intersecting both the first direction and the second direction.

In an exemplary embodiment, the first active pattern may extend in a first direction and the first gate structures may extend in a second direction intersecting the first direction. The first source/drain region may have a width in the second direction. The lower portion of the first source/drain region may include a first lower portion having the a width substantially increasing as it extends away from the substrate in a third direction perpendicular to both the first direction and the second direction; and a second lower portion having the a width substantially decreasing as it extends away from the substrate in the third direction. The first lower portion may be provided between the first active pattern and the second lower portion.

In an exemplary embodiment, the semiconductor device may further include auxiliary spacers provided in the first region and disposed to cover the lower portion of the first source/drain region. The upper portion of the first source/drain region may be exposed by the auxiliary spacers.

In an exemplary embodiment, the semiconductor device may further include first device isolation patterns disposed at opposite sides of the first active pattern. The auxiliary spacers may be disposed on the first device isolation patterns and are spaced apart from each other with the first active pattern interposed therebetween.

In an exemplary embodiment, each of the first gate structures may include a first gate electrode crossing over the first active pattern; and a first gate spacer on both sidewalls of the first gate electrode. The first active pattern may extend in a first direction, and the first gate electrode may extend in a second direction intersecting the first direction. Each of the auxiliary spacers may extend in the first direction to be in contact with the first gate spacer.

In an exemplary embodiment, the auxiliary spacers may include silicon nitride.

In an exemplary embodiment, the first source/drain region may have a first maximum width at a boundary between the first upper portion and the second upper portion, and the second source/drain region may have a second maximum width at a boundary between the first portion and the second portion. The first maximum width may be smaller than the second maximum width.

In an exemplary embodiment, at least one of the first and second source/drain regions may include a first epitaxial layer in contact with the substrate; a second epitaxial layer on the first epitaxial layer; and a third epitaxial layer on the second epitaxial layer. Each of the first and second epitaxial layers may include germanium, and a germanium concentration of the first epitaxial layer may be lower than that of the second epitaxial layer.

A semiconductor device according to other embodiments of the inventive concept may include a substrate including a first region and a second region; a first active pattern protruding upwardly from the substrate in the first region and a second active pattern protruding upwardly from the substrate in the second region; first gate structures crossing over the first active pattern and being spaced apart from each other by a first distance and second gate structures crossing over the second active pattern and being spaced apart from each other by a second distance; a first source/drain region disposed on the first active pattern between the first gate structures; a second source/drain region disposed on the second active pattern between the second gate structures; and auxiliary spacers disposed only in the first region, provided to be spaced apart from each other in a direction parallel to a direction in which the first gate structures cross over the first active pattern, and covering a lower portion of the first source/drain region.

In an exemplary embodiment, the semiconductor device may further include first device isolation patterns disposed at opposite sides of the first active pattern. The auxiliary spacers may be disposed on the first device isolation pattern and may be spaced apart from each other with the first active pattern interposed therebetween.

In an exemplary embodiment, each of the first gate structures may include a first gate electrode crossing over the first active pattern; and a first gate spacer on both sidewalls of the first gate electrode. The auxiliary spacers may be connected to the first gate spacer.

In an exemplary embodiment, the first source/drain region may include an upper portion exposed by the auxiliary spacers.

In an exemplary embodiment, the first source/drain region may include the lower portion being in contact with the first active pattern and having a substantially positively sloped sidewall; and an upper portion including a first upper portion being connected to the lower portion and having a substantially negatively sloped sidewall and a second upper portion being connected to the first upper portion and having a substantially positively sloped sidewall. The second source/drain region may include a first portion being in contract with the second active pattern and having a substantially negatively sloped sidewall; and a second portion being connected to the first portion and having a substantially positively sloped sidewall.

In an exemplary embodiment, the lower portion of the first source/drain region may include a first lower portion being in contact with the first active pattern and having a substantially negatively sloped sidewall; and a second lower portion being connected to the first lower portion and having a substantially positively sloped sidewall.

In an exemplary embodiment, the first distance may be greater than the second distance.

A semiconductor device according to other embodiments of the inventive concept may include a substrate including a first region and a second region; a first active pattern provided to protrude from the substrate in the first region and a second active pattern provided to protrude from the substrate in the second region; first gate structures crossing over the first active pattern and being disposed to be spaced apart from each other by a first distance and second gate structures crossing over the second active pattern and being spaced apart from each other by a second distance smaller than the first distance; a first source/drain region disposed between the first gate structures; a second source/drain region disposed between the second gate structures; and auxiliary spacers spaced apart from each other in a direction parallel to a direction in which the first gate structures extend. The auxiliary spacers may be disposed on sidewalls of a lower portion of the first source/drain region and may not be disposed on sidewalls of a lower portion of the second source/drain region.

In an exemplary embodiment, the semiconductor device may further include first device isolation patterns disposed at opposite sides of the first active pattern. The auxiliary spacers may be disposed on the first device isolation patterns and be spaced apart from each other with the first active pattern interposed therebetween.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings:

FIGS. 2A to 7A are perspective views illustrating a method of manufacturing a semiconductor device according to an embodiment of the inventive concept;

FIGS. 3B to 7B are exemplary cross-sectional views taken along lines A-A', B-B', and C-C' in FIGS. 3A to 7A, respectively;

FIGS. 3C to 7C are exemplary cross-sectional views taken along lines D-D', E-E', and F-F' in FIGS. 3A to 7A, respectively;

DETAILED DESCRIPTION

Figure 1A:
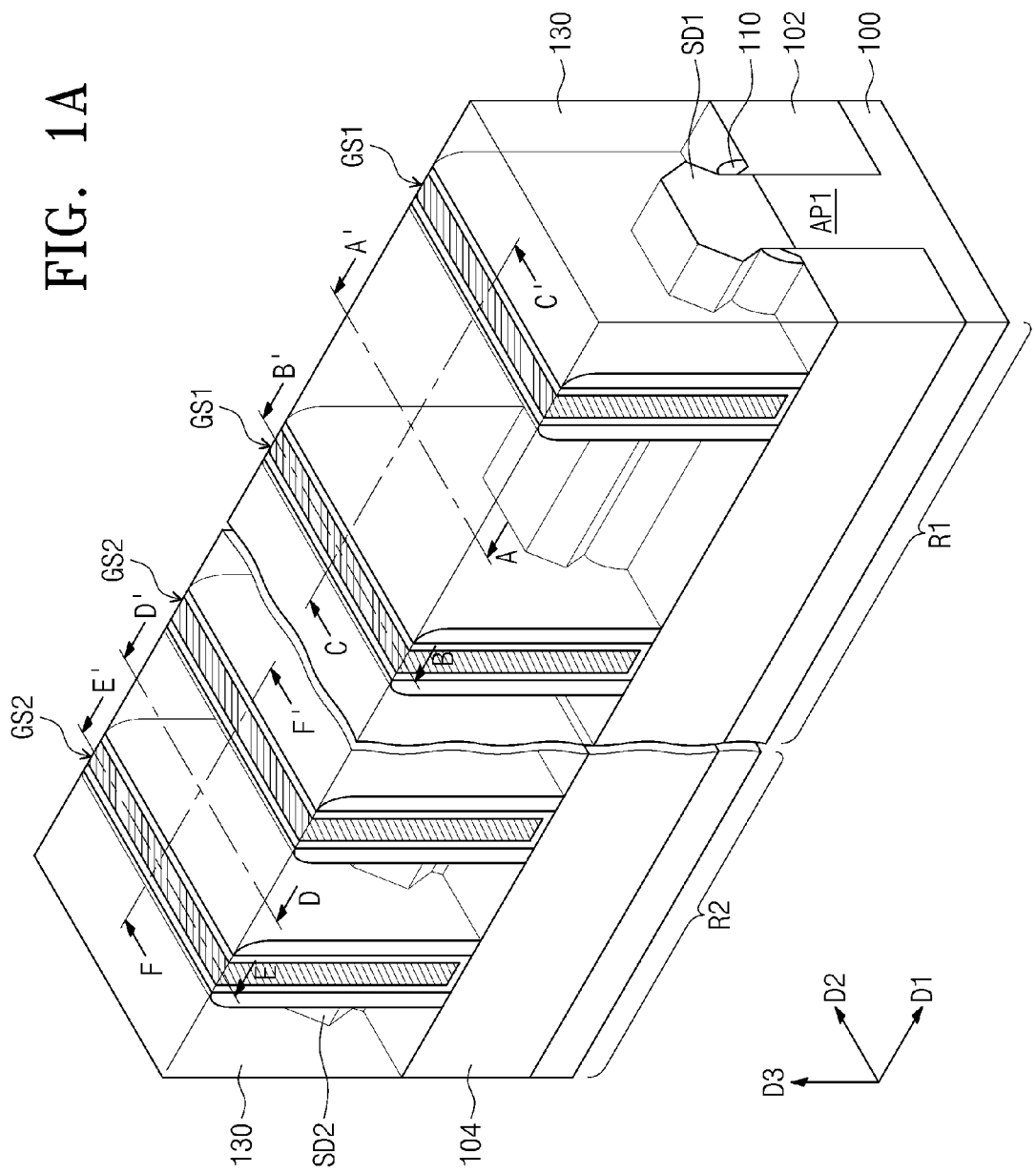
FIG. 1A is a perspective view illustrating a semiconductor device according to an embodiment of the inventive concept.

The advantages and features of the disclosure and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided to disclose the inventive concept without limiting it, and to let those skilled in the art know the category of the inventive concept.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise. In the drawings, thicknesses of elements are exaggerated for clarity of illustration.

Exemplary embodiments of the inventive concept will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention.

Though terms like a first, a second, and a third are used to describe various elements in various embodiments of the inventive concept, the elements are not limited to these terms. Unless the context indicates otherwise, these terms are used only to tell one element from another element, for example as a naming convention. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Hereinafter, embodiments of the inventive concept will now be described more fully with reference to accompanying drawings.

Figure 1B:
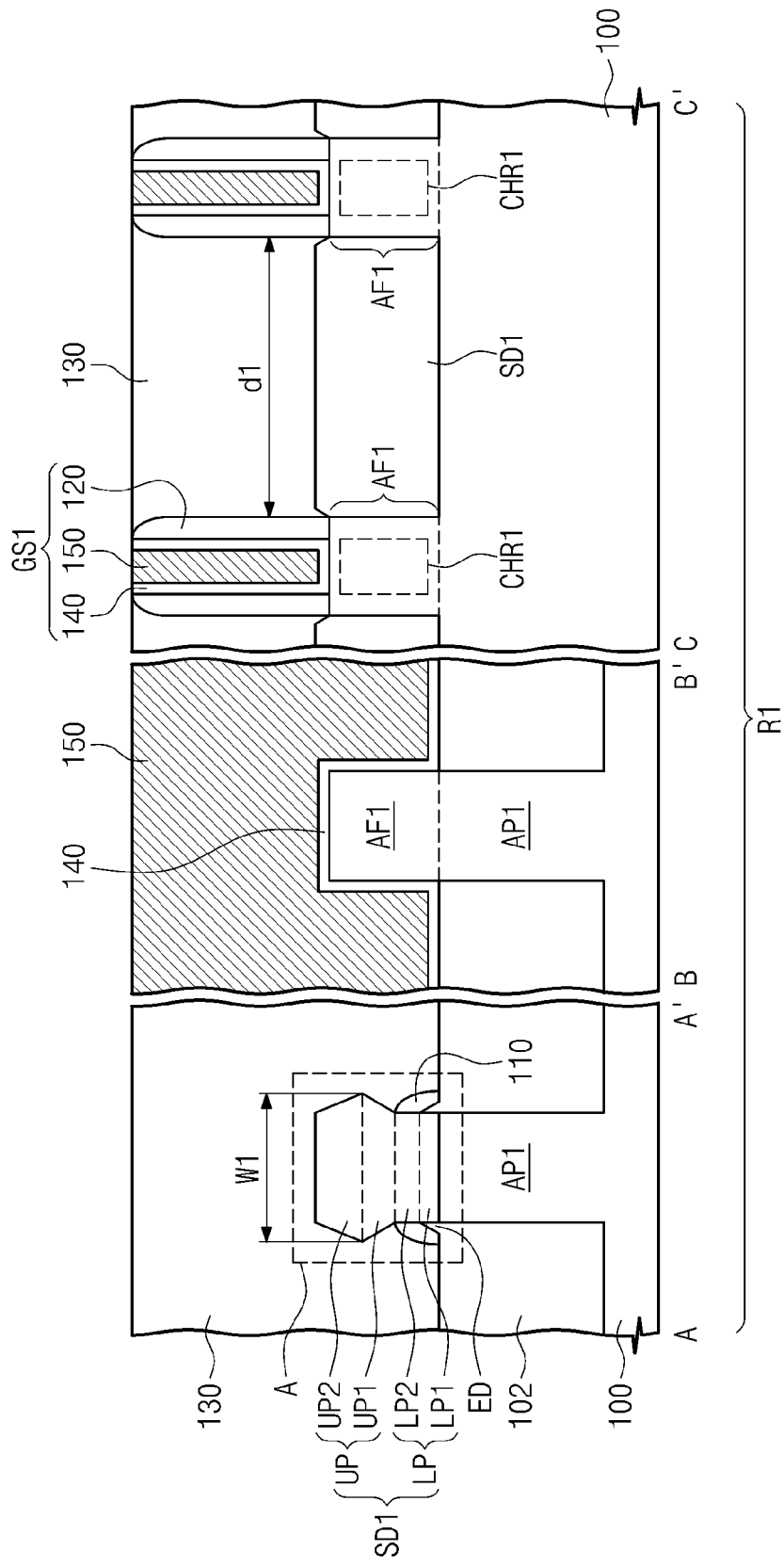
FIG. 1B is an exemplary cross-sectional view taken along lines A-A', B-B', and C-C' in FIG. 1A.

FIG. 1A is a perspective view illustrating a semiconductor device according to an example embodiment of the inventive concept. FIG. 1B is a cross-sectional view taken along lines A-A', B-B', and C-C' in FIG. 1A, and FIG. 1C is a cross-sectional view taken along lines D-D', E-E', and F-F' in FIG. 1A.

Figure 1C:
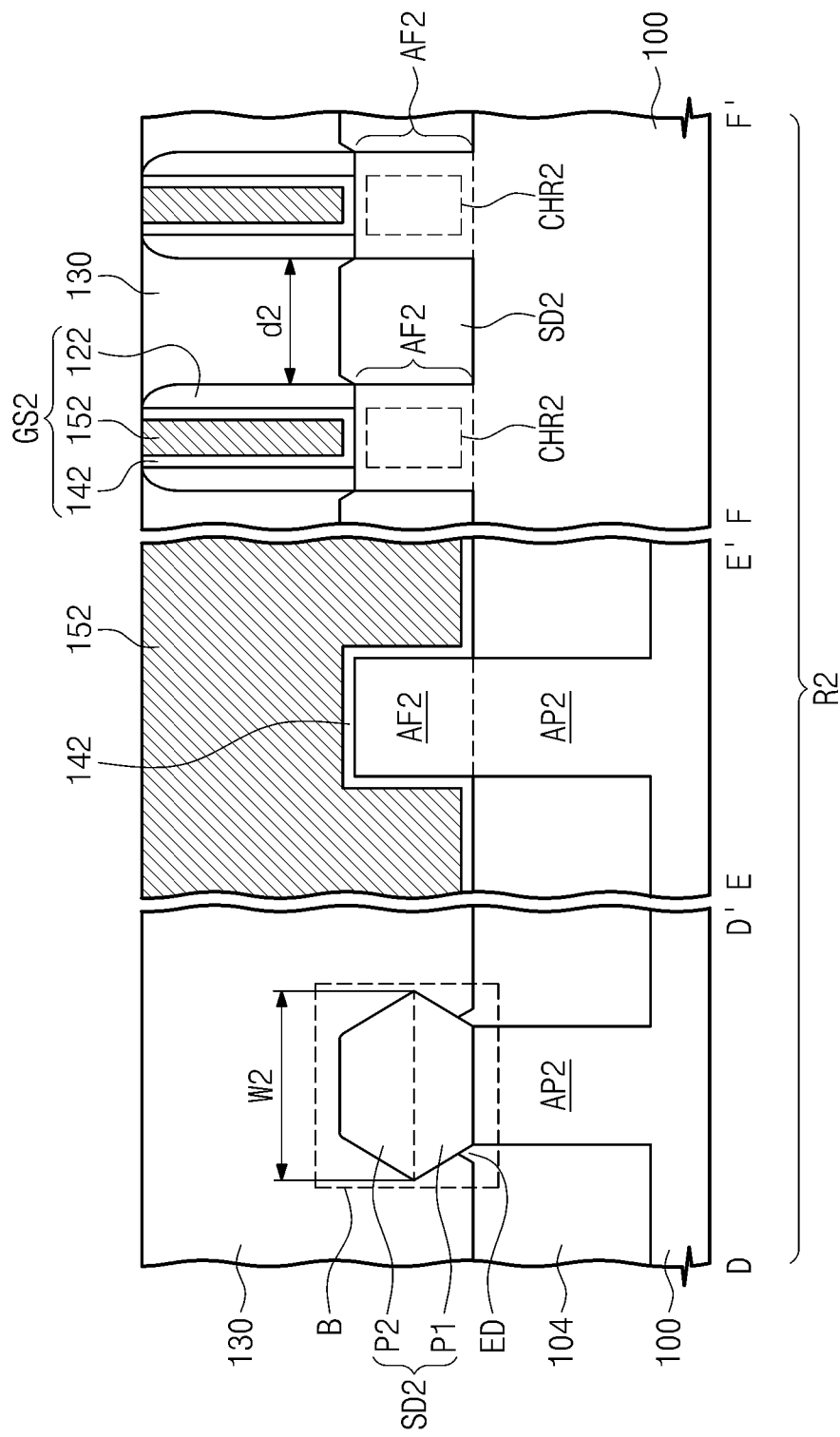
FIG. 1C is an exemplary cross-sectional view taken along lines D-D', E-E', and F-F' in FIG. 1A.

Referring to FIGS. 1A to 1C, active patterns and gate structures crossing over the active patterns may be provided on a substrate 100. The substrate 100 may be, for example, a semiconductor substrate. In some embodiments, the substrate 100 may be a bulk silicon substrate or a silicon-on-insulator (SOI) substrate.

The substrate 100 may include a first region R1 and a second R2 that are different from each other. The active patterns may include a first active pattern AP1 provided in the first region R1 and a second active pattern AP2 provided in the second region R2. The gate structures may include a first gate structure GS1 crossing over the first active pattern AP1 and a second gate structure GS2 crossing over the second active pattern AP2.

Each of the first and second active patterns AP1 and AP2 may have a line shape extending in one direction. The first and second active patterns AP1 and AP2 may extend in the same direction or directions different each other. Hereinafter, for easy explanation, it will be assumed that each of the first and second active patterns AP1 and AP2 has a line shape extending in a first direction D1.

A long axis of each of the first and second active patterns AP1 and AP2 may be parallel to the first direction D1, and a short axis of each of the first and second active patterns AP1 and AP2 may be parallel to a second direction D2 intersecting the first direction D1. Each of the first and second active patterns AP1 and AP2 may have a shape protruding upwardly from the substrate 100 in a direction perpendicular to a top surface of the substrate 100. For example, each of the first and second active patterns AP1 and AP2 may protrude in a third direction D3 perpendicular to both the first direction D1 and the second direction D2.

The first gate structure GS1 may be provided in plurality. The plurality of first gate structures GS1 may cross over the first active pattern AP1, respectively. The second gate structure GS2 may also be provided in plurality. The plurality of second gate structures GS2 may cross over the second active pattern AP2, respectively. The plurality of first gate structures GS1 may extend in the second direction D2, respectively and may be spaced apart from each other in the first direction D1. The plurality of second gate structures GS2 may extend in the second direction D2, respectively and may be spaced apart from each other in the first direction D1. A first distance d1 between the adjacent first gate structures GS1 may be greater than a second distance d2 between the adjacent second gate structures GS2.

First device isolation patterns 102 may be disposed at opposite sides of the first active pattern AP1, and second device isolation patterns 104 may be disposed at opposite sides of the second active pattern AP2. The first and second device isolation patterns 102 and 104 may include oxide, nitride, and/or oxynitride. Each of the first and the second device isolation patterns 102 and 104 may have a line shape extending in the first direction D1. The first device isolation patterns 102 may be spaced apart from each other in the second direction D2 with the first active pattern AP1 interposed therebetween, and the second device isolation patterns 104 may be spaced apart from each other in the second direction D2 with the second active pattern AP2 interposed therebetween.

Each of the first device isolation patterns 102 may cover a portion of a sidewall of the first active pattern AP1. For example, an upper portion of the first active pattern AP1 may be exposed by the first device isolation patterns 102. The exposed upper portion of the first active pattern AP1 may be defined as a first active fin AF1. Each of the second device isolation patterns 104 may cover a portion of a sidewall of the second active pattern AP2. For example, an upper portion of the second active pattern AP2 may be exposed by the second device isolation patterns 104. The exposed upper portion of the second active pattern AP2 may be defined as a second active fin AF2.

The first gate structure GS1 may cross over the first active pattern AP1 and cover a top surface and both sidewalls of the first active fin AF1. The first active fin AF1 may be locally disposed under the first gate structure GS1. The first active fin AF1 may include a first channel region CHR1. The second gate structure GS2 may cross over the second active pattern AP2 and cover a top surface and both sidewalls of the second active fin AF2. The second active fin AF2 may be locally disposed under the second gate structure GS2. The second active fin AF2 may include a second channel region CHR2.

First source/drain regions SD1 and auxiliary spacers 110 may be disposed at opposite sides of the first gate structure GS1. The first source/drain regions SD1 may be disposed on the first active pattern AP1 and at opposite sides of the first gate structure GS1, respectively. The auxiliary spacers 110 may be disposed on the first device isolation patterns 102 and at opposite sides of the first gate structure GS1, respectively. A pair of the auxiliary spacers 110 disposed at any one side of the first gate structure GS1 may be spaced apart from each other with the first active pattern AP1 interposed therebetween. The pair of the auxiliary spacers 110 may be spaced apart from each other in a direction parallel to a direction in which the first gate structures GS1 cross over the first active pattern or extend.

The auxiliary spacers 110 may cover lower portions LP of the first source/drain regions SD1, respectively. In some embodiments, the auxiliary spacers 110 may be in contact with the lower portions LP of the first source/drain regions SD1, respectively. In other embodiments, an edge portion ED extending from a top surface of each of the first device isolation patterns 102 in the third direction D3 may be disposed between each of the auxiliary spacers 110 and the lower portion LP of each of the first source/drain regions SD1. In this case, each of the auxiliary spacers 110 may partially contact the lower portion LP of each of the first source/drain regions SD1.

The first gate structure GS1 may include a first gate electrode 150 crossing over the first active pattern AP1, a first gate spacer 120 on both sidewalls of the first gate electrode 150, and a first gate dielectric pattern 140 between the first gate electrode 150 and the first gate spacer 120. The first gate dielectric pattern 140 may also be disposed between the first gate electrode 150 and the first active fin AF1 and may horizontally extend from the first active fin AF1 to partially cover a top surface of each of the first device isolation patterns 102. The first gate dielectric pattern 140 may extend along a bottom surface of the first gate electrode 150.

Each of the auxiliary spacers 110 may extend in the first direction D1 to be in contact with the first gate spacer 120. In detail, each of the auxiliary spacers 110 may extend along a boundary between one of the first source/drain regions SD1 and one of the first device isolation patterns 102 adjacent thereto to be in contact with the first gate spacer 120. The auxiliary spacers 110 may include the same material as the first gate spacer 120. For example, the auxiliary spacers 110 may include silicon nitride.

In one embodiment, the first source/drain regions SD1 may be epitaxial patterns formed using the first active pattern AP1 as a seed. The first source/drain regions SD1 may include at least one of silicon germanium (SiGe), silicon (Si), and silicon carbide (SiC) epitaxially grown from the substrate 100.

Each of the first source/drain regions SD1 may be covered with the auxiliary spacers 110 and may include the lower portion LP in direct contact with the first active pattern AP1 and an upper portion UP exposed by the auxiliary spacers 110. The lower portion LP may include a first lower portion LP1 in contact with the first active pattern AP1 and a second lower portion LP2 spaced apart from the first active pattern AP1 with the first lower portion LP1 interposed therebetween. The upper portion UP may include a first upper portion UP1 in contact with the lower portion LP and a second upper portion UP2 spaced apart from the lower portion LP with the first upper portion UP1 interposed therebetween.

Figure 8A:
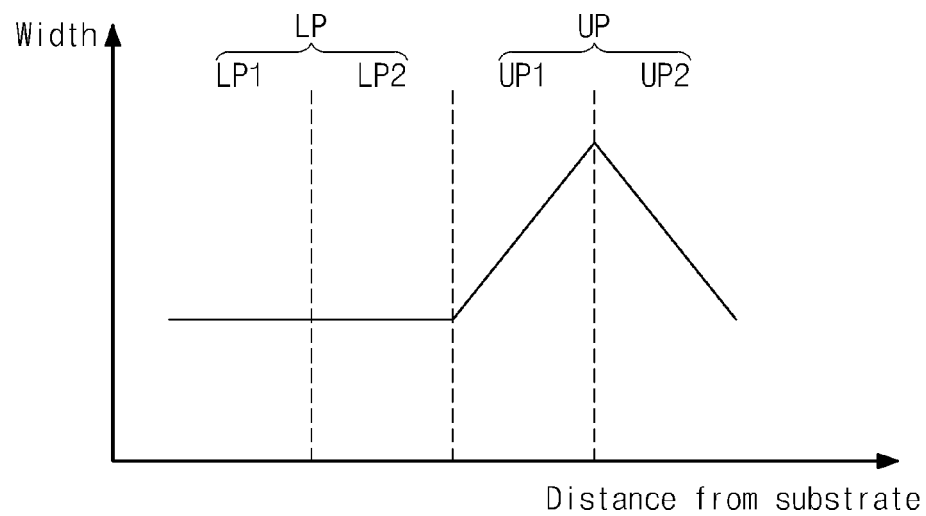
FIGS. 8A to 8C are graphs respectively showing an exemplary width of each of first source/drain regions depending on a distance from a substrate.
Figure 8B:
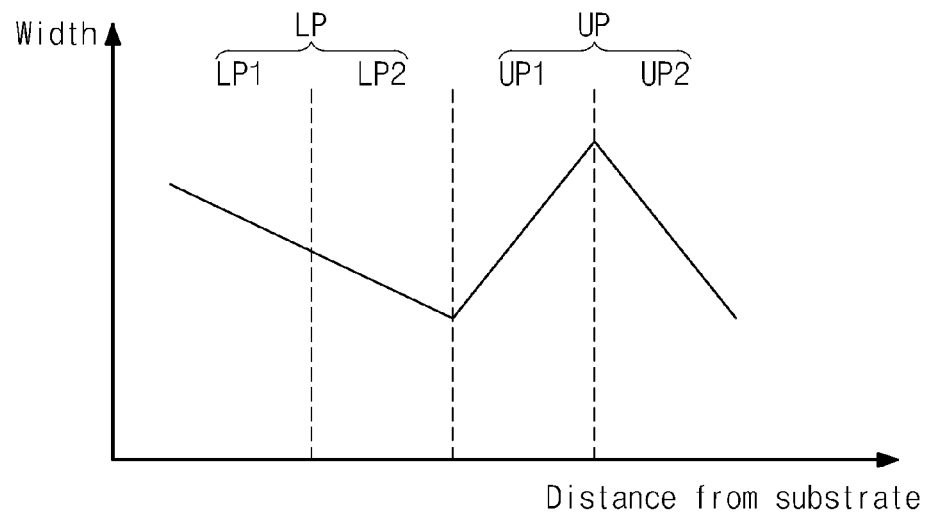
Figure 8C:
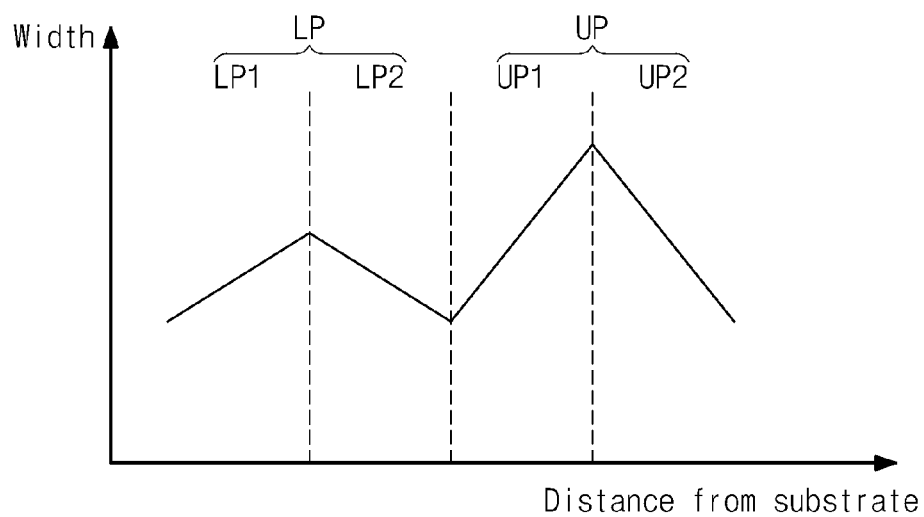

FIGS. 8A to 8C are graphs respectively showing an exemplary width of each of first source/drain regions depending on a distance from a substrate. The width is a distance in the second direction D2 and a distance between both sidewalls of each the first source/drain regions SD1.

Referring to FIG. 8A, according to an embodiment, the lower portion LP may have substantially the same width as they extend away from the substrate 100. In detail, the first lower portion LP1 and the second lower portion LP2 may have substantially the same width as they extend away from the substrate 100 in the third direction D3. As such, the lower portion LP may have a sidewall that is substantially perpendicular to a top surface of the substrate 100. The first upper portion UP1 may have a width increasing as it extends away from the substrate 100 in the third direction D3, and the second upper portion UP2 may have a width decreasing as it extends away from the substrate 100 in the third direction D3. In this case, a sidewall of the first upper portion UP1 may be sloped to the top surface of the substrate 100. For example, an angle between the top surface of the substrate 100 and an extending surface of the sidewall of the first upper portion UP1 may be greater than about 90 degrees. As such, the sidewall of the first upper portion UP1 may have a substantially negatively sloped profile. A sidewall of the second upper portion UP2 may be sloped to the top surface of the substrate 100. For example, an angle between the top surface of the substrate 100 and an extending surface of the sidewall of the second upper portion UP2 may be smaller than about 90 degrees. As such, the sidewall of the second portion UP2 may have a substantially positively sloped profile. As such, the sidewalls of the first upper portion UP1 slope away from each other as they extend above the substrate 100, and the sidewalls of the second upper portion UP2 slope toward each other as they extend above the substrate 100.

The width of each of the first source/drain regions SD1 may be maximized at a boundary between the first upper portion UP1 and the second upper portion UP2. Thus, each of the first source/drain regions SD1 may have a first maximum width W1 at the boundary between the first upper portion UP1 and the second upper portion UP2.

Referring to FIG. 8B, according to another embodiment, the lower portion LP may have a width that substantially decreases as it extends away from the substrate 100 in the third direction D3. In this case, a sidewall of the lower portion LP may be sloped to the top surface of the substrate 100 and an angle between the top surface of the substrate 100 and the sidewall of the lower portion LP may be smaller than about 90 degrees. As such, the sidewall of the lower portion LP may have a substantially positively sloped profile. The first upper portion UP1 and the second upper portion UP2 may have the same width and shape as those described with reference to FIG. 8A, respectively.

Referring to FIG. 8C, according to another embodiment, the first lower portion LP1 may have a width that substantially increases as it extends away from the substrate 100 in the third direction D3 and the second lower portion LP2 may have a width that substantially decreases as it extends away from the substrate 100 in the third direction D3. In this case, a sidewall of the first lower portion LP1 may be sloped to the top surface of the substrate 100. For example, an angle between the top surface of the substrate 100 and the sidewall of the first lower portion LP1 may be greater than about 90 degrees. As such, the sidewall of the first lower portion LP1 may have a substantially negatively sloped profile. A sidewall of the second lower portion LP2 may be sloped to the top surface of the substrate 100. For example, an angle between the top surface of the substrate 100 and an extending surface of sidewall of the second lower portion LP2 may be smaller than about 90 degrees. As such, the sidewall of the second lower portion LP2 may have a substantially positively sloped profile. The first upper portion UP1 and the second upper portion have the same width and shape as those described with reference to FIG. 8A, respectively.

When viewed in a cross-sectional view in FIG. 1B, the first active fin AF1 may have a top surface higher than a bottom surface of each of the first source/drain regions SD1. The first active fin AF1 may be disposed between the first source/drain regions SD1.

Referring to FIGS. 1A and 1C, second source/drain regions SD2 may be disposed at opposite sides of the second gate structure GS2. The second source/drain regions SD2 may be disposed on the second active pattern AP2 and at the opposite sides of the second gate structure GS2, respectively. The auxiliary spacers 110 may be disposed only within the first region R1 and may not be disposed in the second region R2.

The second source/drain regions SD2 may be epitaxial patterns formed using the second active pattern AP2 as a seed. For example, the second source/drain regions SD2 may include at least one of silicon germanium (SiGe), silicon (Si), and silicon carbide (SiC) epitaxially grown from the substrate 100. Each of the second source/drain regions SD2 may include a first portion P1 adjacent to the substrate 100 and a second portion P2 relatively far away from the substrate 100.

Figure 8D:
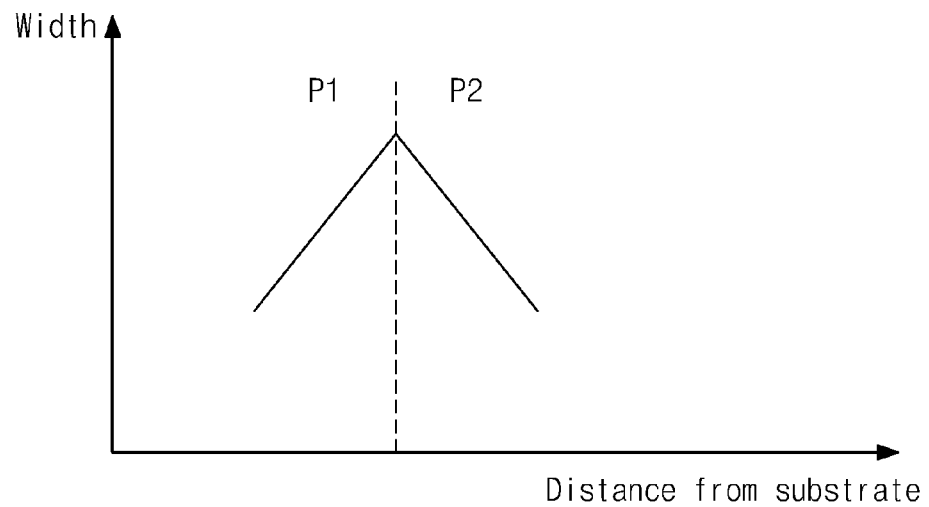
FIG. 8D is a graph showing an exemplary width of each of second source/drain regions depending on a distance from a substrate.

FIG. 8D is a graph showing a width of each of second source/drain regions depending on a distance from a substrate. The width is a distance in a second direction D2 and a distance between both sidewalls of each the second source/drain regions SD2.

Referring to FIG. 8D, the first portion P1 may have a width that substantially increases as it extends away from the substrate 100 in the third direction D3 and the second portion P2 may have a width that substantially decreases as it extends away from the substrate 100 in the third direction D3. A sidewall of the first portion P1 may be sloped to the top surface of the substrate 100. For example, an angle between the top surface of the substrate 100 and the sidewall of the first portion P1 may be greater than about 90 degrees. As such, the sidewall of the first portion P1 may have a negatively sloped profile. A sidewall of the second portion P2 may be sloped to the top surface of the substrate 100. For example, an angle between the top surface of the substrate 100 and an extending surface of the sidewall of the second portion P2 may be smaller than about 90 degrees. As such, the sidewall of the second portion P2 may have a substantially positively sloped profile.

The width of each of the second source/drain regions SD2 may be maximized at a boundary between the first portion P1 and the second portion P2. For example, each of the second source/drain regions SD2 may have a second maximum width W2 at the boundary between the first portion P1 and the second portion P2. The second maximum width W2 may be greater than the first maximum width W1. The first portion P1 of each of the second source/drain regions SD2 may be directly connected to the second active pattern AP2.

Figure 9A:
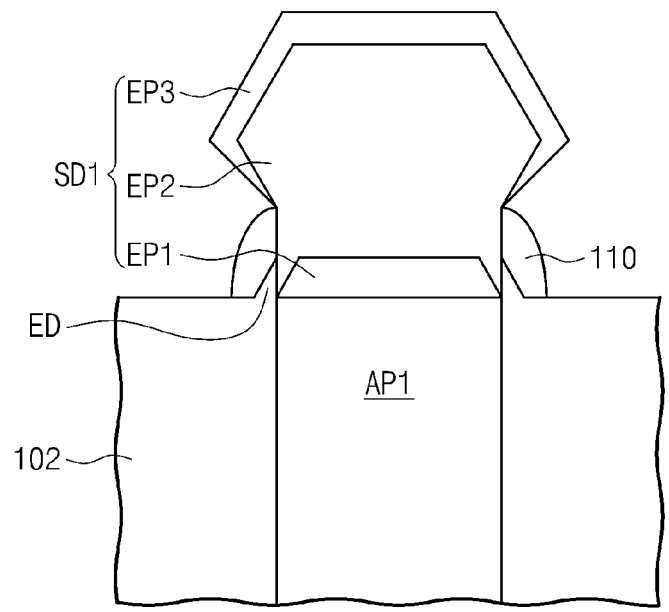
FIGS. 9A and 9B are exemplary enlarged views of a portion "A" in FIG. 1B and a portion "B" in FIG. 1C, respectively.
Figure 9B:
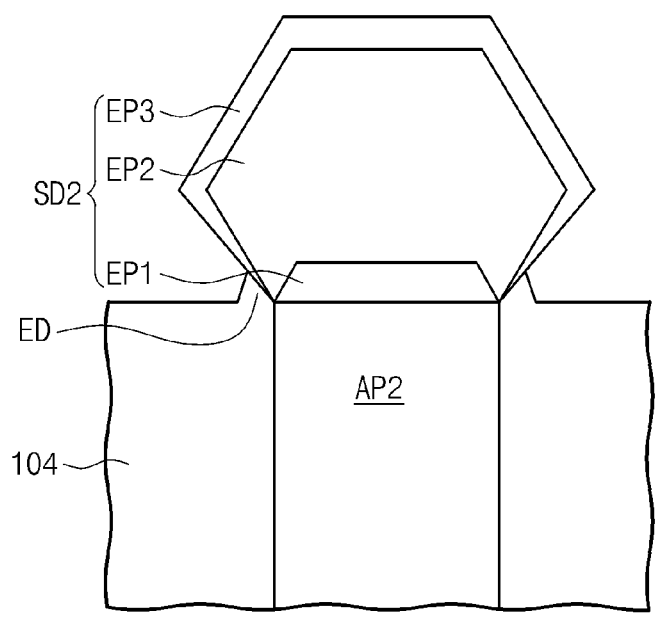

FIGS. 9A and 9B are enlarged views of a portion "A" in FIG. 1B and a portion "B" in FIG. 1C, respectively. Referring to FIGS. 9A and 9B, at least one of the first and second source/drain regions SD1 and SD2 may include multilayered epitaxial layers. For example, a first epitaxial layer EP1 may serve as a buffer layer disposed in the lower portion LP of each of the first source/drain regions SD1 and/or the first portion P1 of each of the second source/drain regions SD2. The first epitaxial layer EP1 includes a lightly doped semiconductor material in contact with the first active patterns AP1 and/or the second active pattern AP2. A second epitaxial layer EP2 may serve as a main layer extending to the upper portion UP from the lower portion LP of each of the first source/drain regions SD1 and/or extending to the second portion P2 from the first portion P1 of each of the second source/drain regions SD2. The second epitaxial layer EP2 may include a heavily doped semiconductor material. A third epitaxial layer EP3 may serve as a capping layer disposed on the second epitaxial layer EP2 to protect the second epitaxial layer EP2. The third epitaxial layer EP3 may include a semiconductor material. For example, when the first source/drain regions SD1 and/or the second source/drain regions SD2 includes SiGe, the first epitaxial layer EP1 may be an SiGe layer including lightly doped Ge, the second epitaxial layer EP2 may be an SiGe layer including heavily doped Ge, and the third epitaxial layer EP3 may be an Si layer.

The second gate structure GS2 may includes a second gate electrode 152 crossing over the second active pattern AP2, a second gate spacer 122 on both sidewalls of the second gate electrode 152, and a second gate dielectric pattern 142 between the second gate electrode 152 and the second gate spacer 122. The second gate dielectric pattern 142 may also be disposed between the second gate electrode 152 and the second active fin AF2 and may horizontally extend from the second active fin AF2 to partially cover a top surface of each of the second device isolation patterns 104. The second gate dielectric pattern 142 may extend along a bottom surface of the second gate electrode 152.

When viewed in a cross-sectional view in the FIG. 1C, the second active fin AF2 may have a top surface higher than a bottom surface of each of the second source/drain regions SD2. The second active fin AF2 may be disposed between the second source/drain regions SD2.

Referring to FIGS. 1A to 1C, the first and second gate electrodes 150 and 152 may include at least one of conductive metal nitride (e.g., titanium nitride, tantalum nitride, etc.) and a metal (e.g., aluminum, tungsten, etc.). The first and second gate spacers 120 and 122 may include an insulating material. For example, the first and second gate spacers 120 and 122 may include nitride (e.g., silicon nitride). The first and second gate dielectric patterns 140 and 142 may include at least one high-k dielectric layer. For example, the first and second gate dielectric patterns 140 and 142 may include at least one of hafnium oxide, hafnium silicate, zirconium oxide, and/or zirconium silicate, but the inventive concept is not limited to these materials.

A lower interlayer dielectric 130 may be disposed on the substrate 100 to cover both sidewalls of each of the first and second gate structures GS1 and GS2, the first and second source/drain regions SD1 and SD2, and the auxiliary spacers 110. The lower interlayer dielectric 130 may include at least one of silicon oxide, silicon nitride, silicon oxynitride, and/or low-k dielectrics.

Although not shown, an upper interlayer dielectric may be disposed on the substrate 100 including the first and second gate structures GS1 and GS2. The upper interlayer dielectric may include oxide, nitride, and/or oxynitride. First contact holes may be formed to expose the first source/drain regions SD1 through the upper interlayer dielectric and the lower interlayer dielectric 130, and second contact holes may be formed to expose the second source/drain regions SD2 through the upper interlayer dielectric and the lower interlayer dielectric 130. Contact plugs may be disposed in the first and second contact holes. Interconnections may be disposed on the upper interlayer dielectric to be connected to the contact plugs. The interconnections may be connected to the first and second source/drain regions SD1 and SD2 through the contact plugs, respectively. The contact plugs and the interconnections may include a conductive material.

FIGS. 2A to 7A are perspective views illustrating a method of manufacturing a semiconductor device according to an example embodiment of the inventive concept. FIGS. 2B and 2C are cross-sectional views taken along lines I-I', II-II', III-III' and IV-IV' in FIG. 2A. FIGS. 3B to 7B are cross-sectional views taken along lines A-A', B-B', and C-C' in FIGS. 3A to 7A, respectively. FIGS. 3C to 7C are cross-sectional views taken along lines D-D', E-E', and F-F' in FIGS. 3A to 7A, respectively.

Figure 2A:
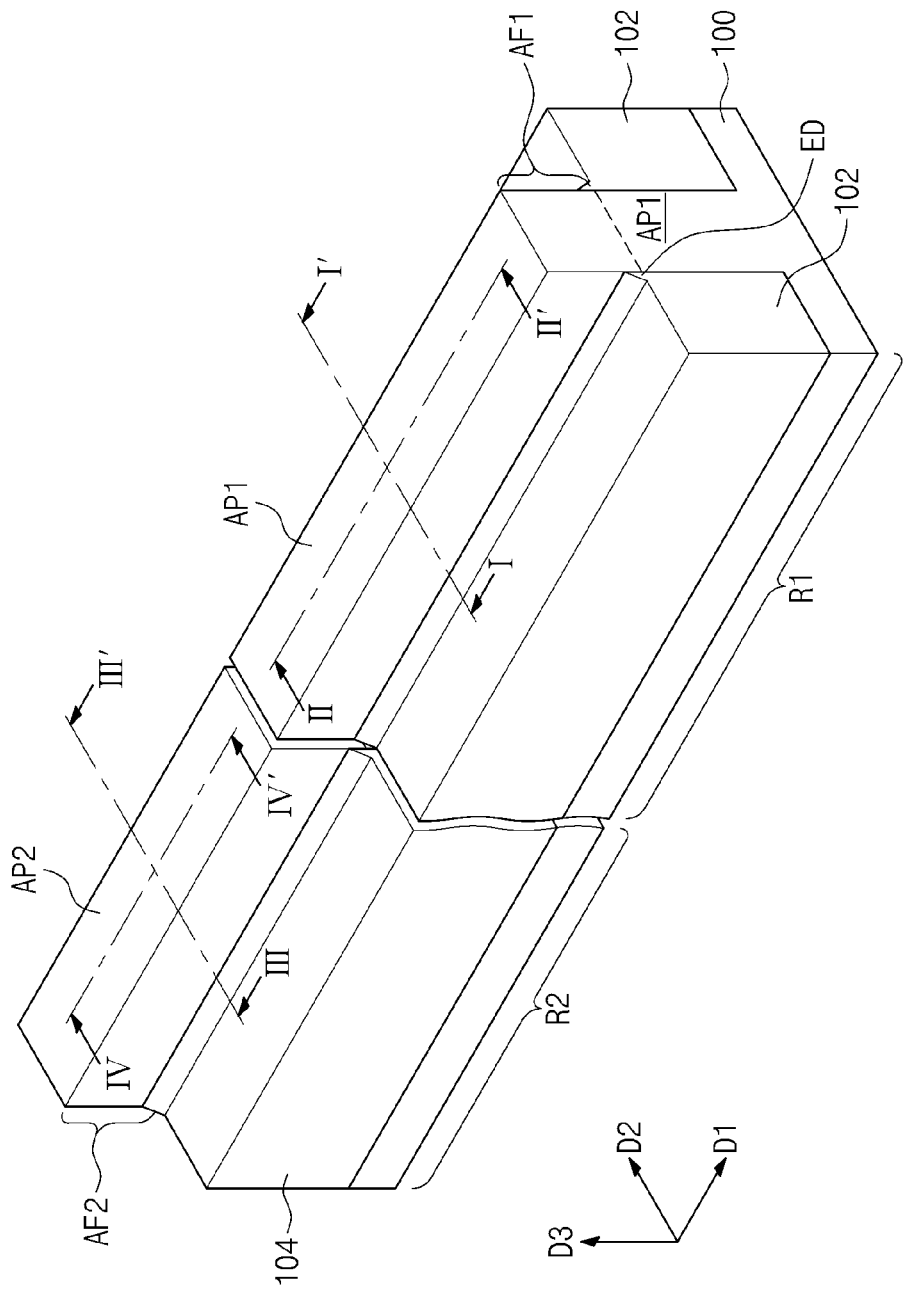
Figure 2B:
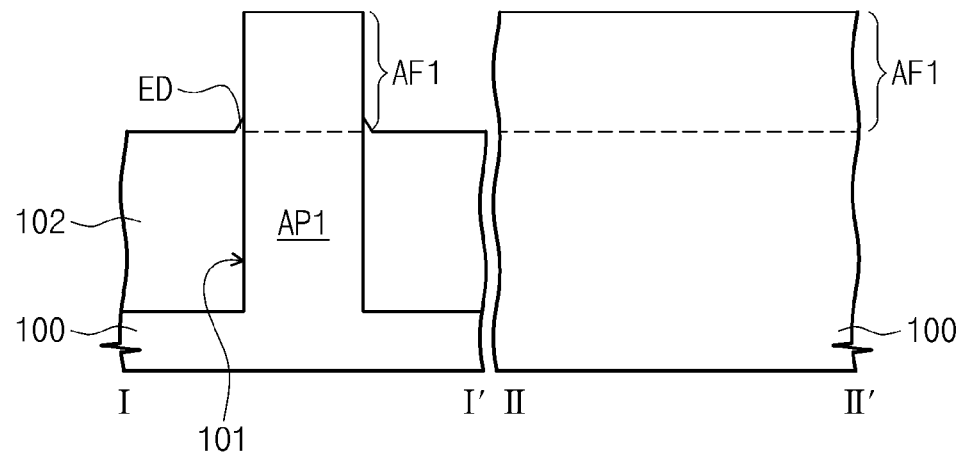
FIG. 2B is an exemplary cross-sectional view taken along lines I-I' and II-II' in FIG. 2A.
Figure 2C:
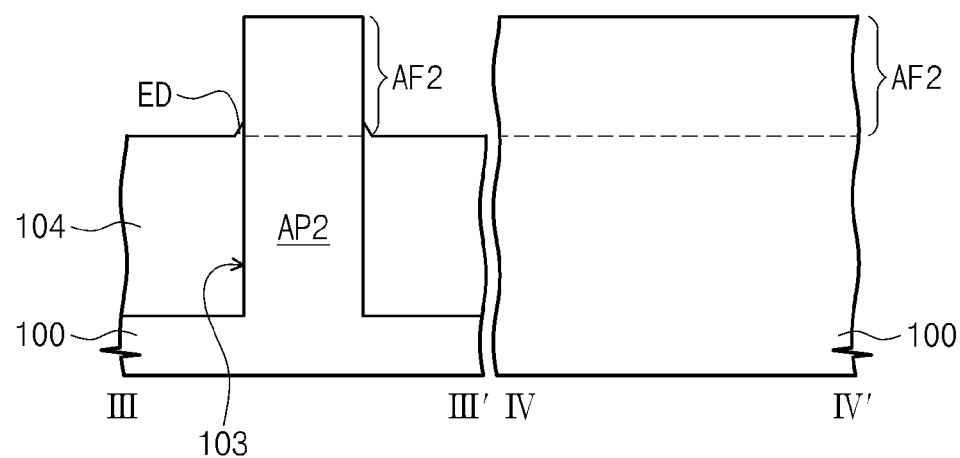
FIG. 2C is an exemplary cross-sectional view taken along lines III-III' and IV-IV' in FIG. 2A.

Referring to FIGS. 2A to 2C, a substrate 100 including a first region R1 and a second region R2 may be provided. The first region R1 is different from a second region R2. The substrate 100 may be, for example, a bulk silicon substrate or a SOI substrate. In the first region R1, the substrate 100 is patterned to form first trenches 101. The first trenches 101 may define a first active pattern AP1. In the second region R2, the substrate 100 is patterned to form second trenches 103. The second trenches 103 may define a second active pattern AP2. The first trenches 101 and the second trenches 103 may be formed at the same time. The first trenches 101 may extend in a first direction D1 and may be spaced apart from each other in a second direction D2 intersecting the first direction D1. Thus, the first active pattern AP1 may be formed to extend in the first direction D1. The second trenches 103 may extend in the first direction and may be spaced apart from each other in the second direction D2. Thus, the second active pattern AP2 may be formed to extend in the first direction D1.

The formation of the first and second trenches 101 and 103 may include forming mask patterns on the substrate 100 and anisotropically etching the substrate 100 using the mask patterns as etch masks. Although not shown, according to some embodiments, the first and second trenches 101 and 103 may be formed to have downwardly decreasing widths, respectively. Thus, the first and second active patterns AP1 and AP2 may be formed to have upwardly decreasing widths, respectively.

First device isolation patterns 102 and second device isolation patterns 104 may be formed to fill the first trenches 101 and the second trenches 103, respectively. The formation of the first and second device isolation patterns 102 and 104 may include forming a device isolation layer on the substrate 100 to fill the first and second trenches 101 and 103 and planarizing the device isolation layer to expose top surfaces of the mask patterns.

Top surfaces of the first and second device isolation patterns 102 and 104 may be recessed to expose upper portions of the first and second active patterns AP1 and AP2, respectively. The recessing of the top surfaces of the first and second device isolation patterns 102 and 104 may be performed by, for example, a wet etch process and may performed using an etch recipe having an etch selectivity with respect to the first and second active patterns AP1 and AP2. The exposed upper portion of the first active pattern AP1 may be defined as a first active fin AF1, and the exposed upper portion of the second active pattern AP2 may be defined as a second active fin AF2. While the top surfaces of the first and second device isolation patterns 102 and 104 are recessed, the mask patterns may be removed to expose top surfaces of the first and second active fins AF1 and AF2. According to some embodiments, while the top surfaces of the first and second device isolation patterns 102 and 104 are recessed, a portion of each of the first and second device isolation patterns 102 and 104 may not be etched and remain on both sidewalls of each of the first and second active patterns AP1 and AP2. The remaining portion of each of the first and second device isolation patterns 102 and 104 may be defined as an edge portion ED which is in contact with each of the first and second active pattern.

Figure 3A:
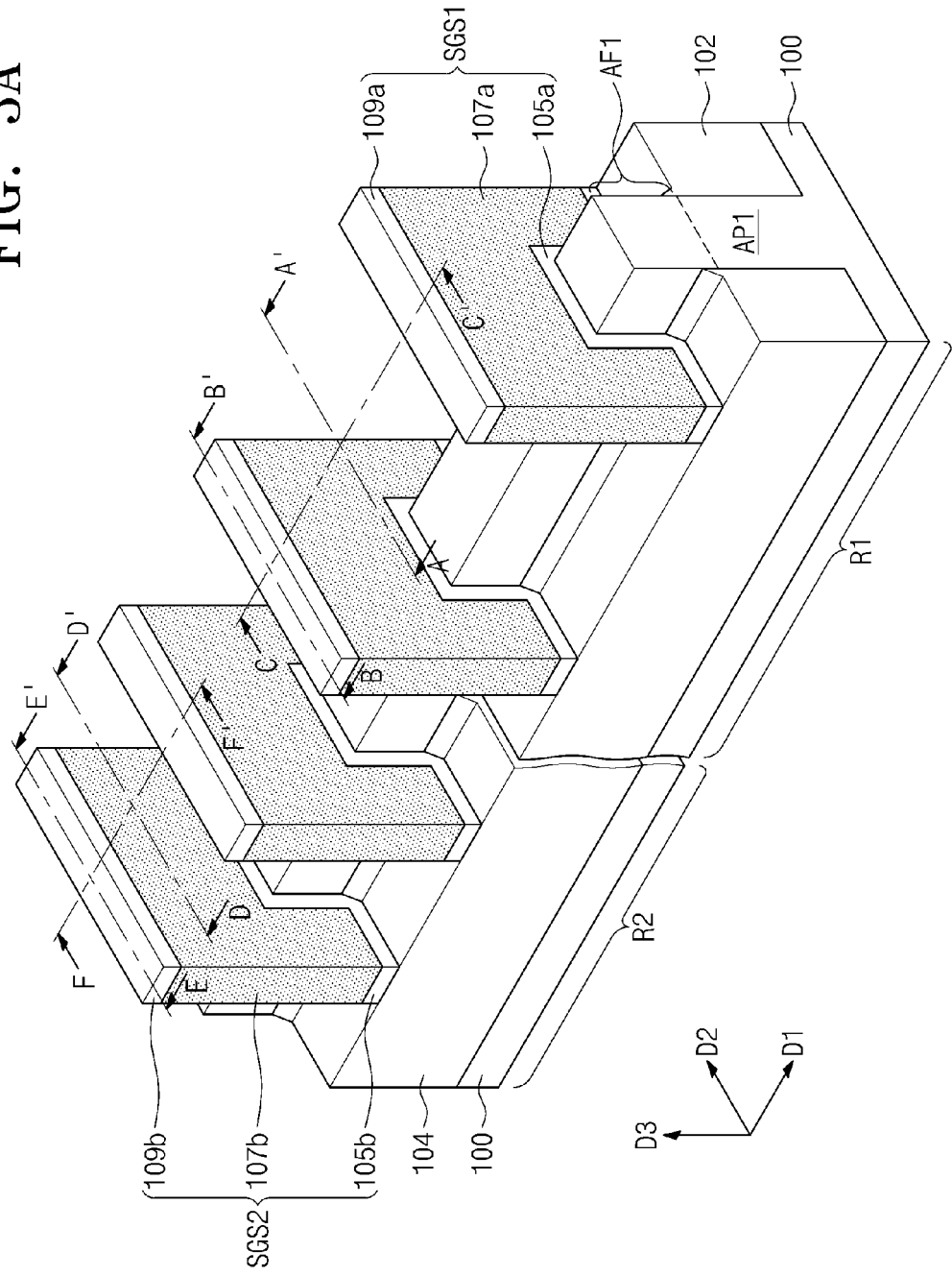
Figure 3B:
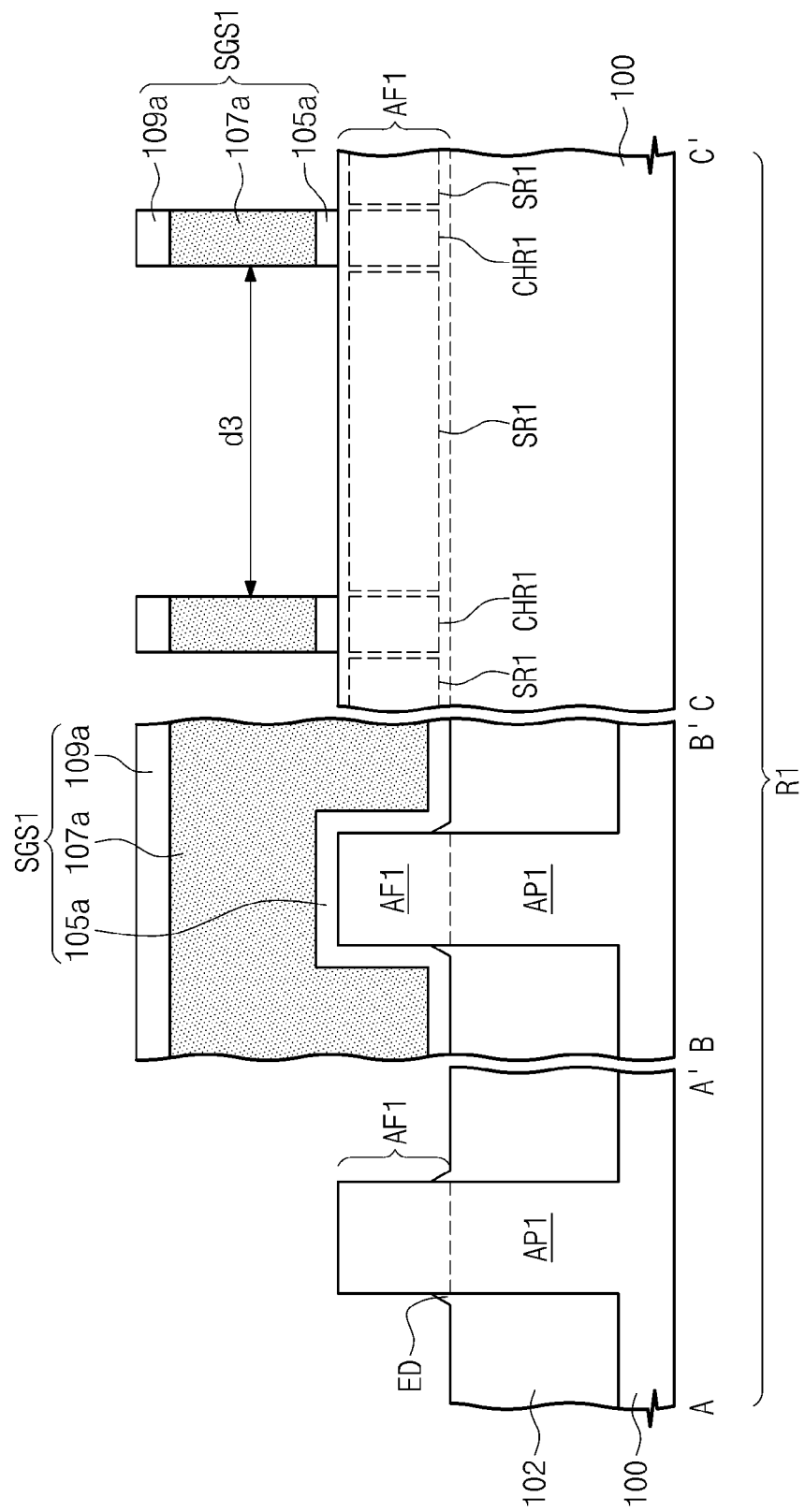
Figure 3C:
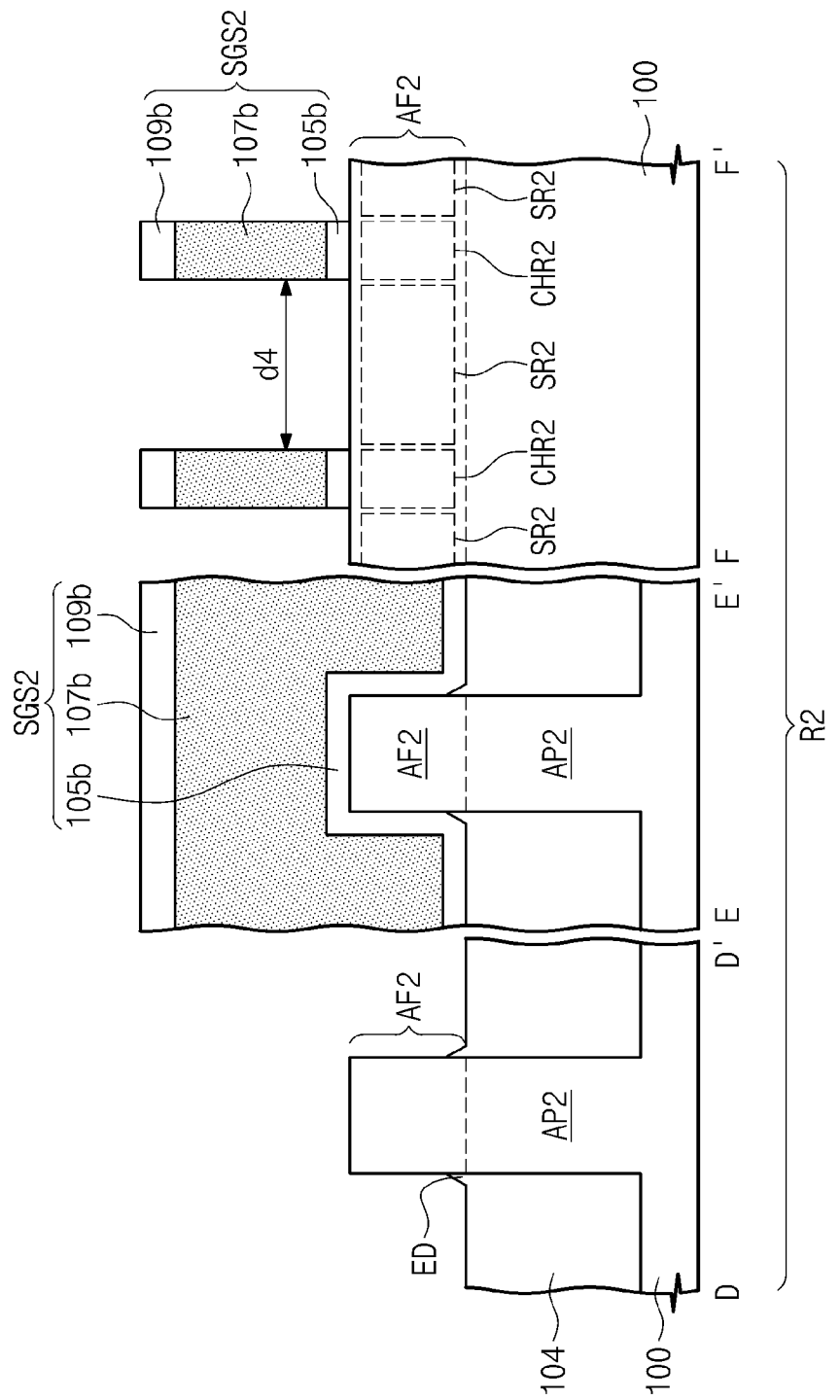

Referring to FIGS. 3A and 3C, an etch-stop layer and a sacrificial gate layer may be sequentially formed on the substrate 100 to cover the first and second active fins AF1 and AF2. The etch-stop layer may include, for example, silicon oxide. The sacrificial gate layer may include a material having an etch selectivity with respect to the etch-stop layer. The sacrificial gate layer may include, for example, polysilicon.

The sacrificial gate layer may be patterned to form a first sacrificial gate pattern 107a crossing over the first active fin AF1 and a second sacrificial gate pattern 107b crossing over the second active fin AF2. The formation of the first and second sacrificial gate patterns 107a and 107b may include forming a first gate mask pattern 109a on the sacrificial gate layer in the first region R1, forming a second gate mask pattern 109b on the sacrificial gate layer in the second region R2, and etching the sacrificial gate layer using the first and second gate mask patterns 109a and 109b as etch masks. The first and second gate mask patterns 109a and 109b may include, for example, silicon nitride. The etching of the sacrificial gate layer may be performed under an etching condition having an etch selectivity with respect to the etch-stop layer.

After the first and second sacrificial gate patterns 107a and 107b are formed, the etch-stop layer at the opposite sides of each of the first and second sacrificial gate patterns 107a and 107b may be removed to form a first etch-stop pattern 105a under the first sacrificial gate pattern 107a and to form a second etch-stop pattern 105b under the second sacrificial gate pattern 107b. The first etch-stop pattern 105a may extend along a bottom surface of the first sacrificial gate pattern 107a to cover a portion of a top surface of each of the first device isolation patterns 102 and a portion of the first active fin AF1. The second etch-stop pattern 105b may extend along a bottom surface of the second sacrificial gate pattern 107 to cover a portion of a top surface of each of the second device isolation patterns 104 and a portion of the second active fin AF2.

As the first sacrificial gate pattern 107a is formed to cross over the first active fin AF1, a first channel region CHR1 and first sacrificial regions SR1 may be defined at the first active fin AF1. The first channel region CHR1 may be a portion of the first active fin AF1 that is disposed below the first sacrificial gate pattern 107a and overlaps the first sacrificial gate pattern 107a. The first sacrificial regions SR1 are other portions of the first active fin AF1 that are disposed at opposite sides of the first sacrificial gate pattern 107a. The sacrificial regions SR1 may be horizontally divided by the first channel region CHR1.

As the second sacrificial gate pattern 107b is formed to cross over the second active fin AF2, a second channel region CHR2 and second sacrificial regions SR2 may be defined at the second active fin AF2. The second channel region CHR2 is a portion of the second active fin AF2 that is disposed below the second sacrificial gate pattern 107b and overlaps the second sacrificial gate pattern 107b. The second sacrificial regions SR2 are other portions of the second active fin AF2 that are disposed at opposite sides of the second sacrificial gate pattern 107b. The sacrificial regions SR2 may be horizontally divided by the second channel region CHR2.

The first etch-stop pattern 105a, the first sacrificial gate pattern 107a, and the first gate mask pattern 109a may be defined as a first sacrificial gate structure SGS1, and the second etch-stop pattern 105b, the second sacrificial gate pattern 107b, and the second gate mask pattern 109b may be defined as a second sacrificial gate structure SGS2.

According to an example embodiment, a plurality of first sacrificial gate structures SGS1 may be formed on the substrate 100 in the first region R1 to cross over the first active pattern AP1, respectively, and a plurality of second sacrificial gate structures SGS2 may be formed on the substrate 100 in the second region R2 to cross over the second active pattern AP2, respectively. A third distance d3 between a pair of first sacrificial gate structures SGS1 adjacent to each other may be greater than a fourth distance d4 between a pair of second sacrificial gate structures SGS2 adjacent to each other. Thus, a distance of each of the first sacrificial regions SR1 of the first active fin AF1 exposed by the first sacrificial gate structures SGS1 may be greater than a distance of each of the second sacrificial regions SR2 of the second active fin AF2 exposed by the second sacrificial gate structures SGS2. The distance of each of the first sacrificial regions SR1 is a distance in a long-axis direction of the first pattern AP1 (e.g., the first direction D1) and the distance of each of the second sacrificial SR2 is a distance in a long-axis direction of the second active pattern AP2 (e.g., the first direction D1).

Figure 4A:
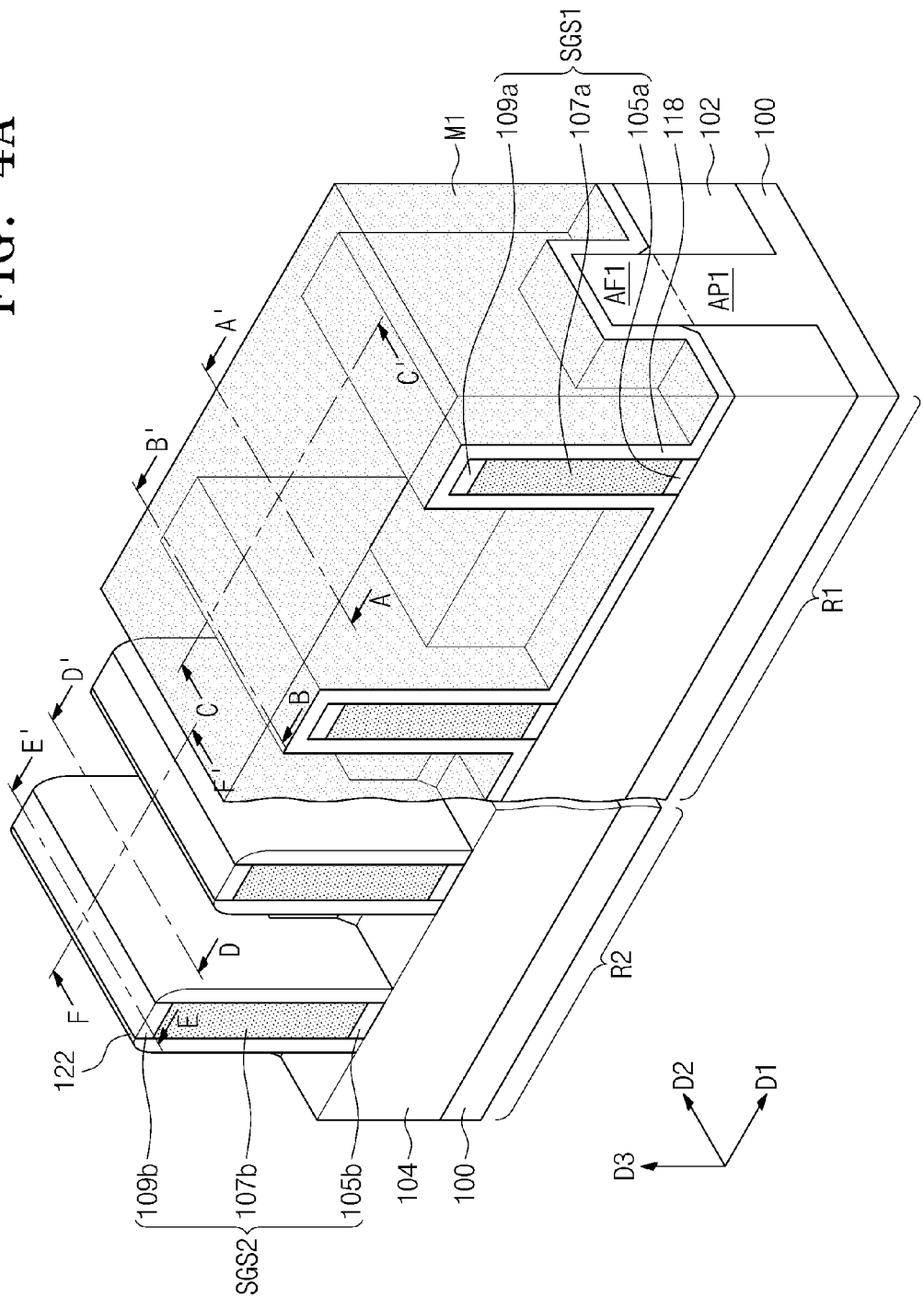
Figure 4C:
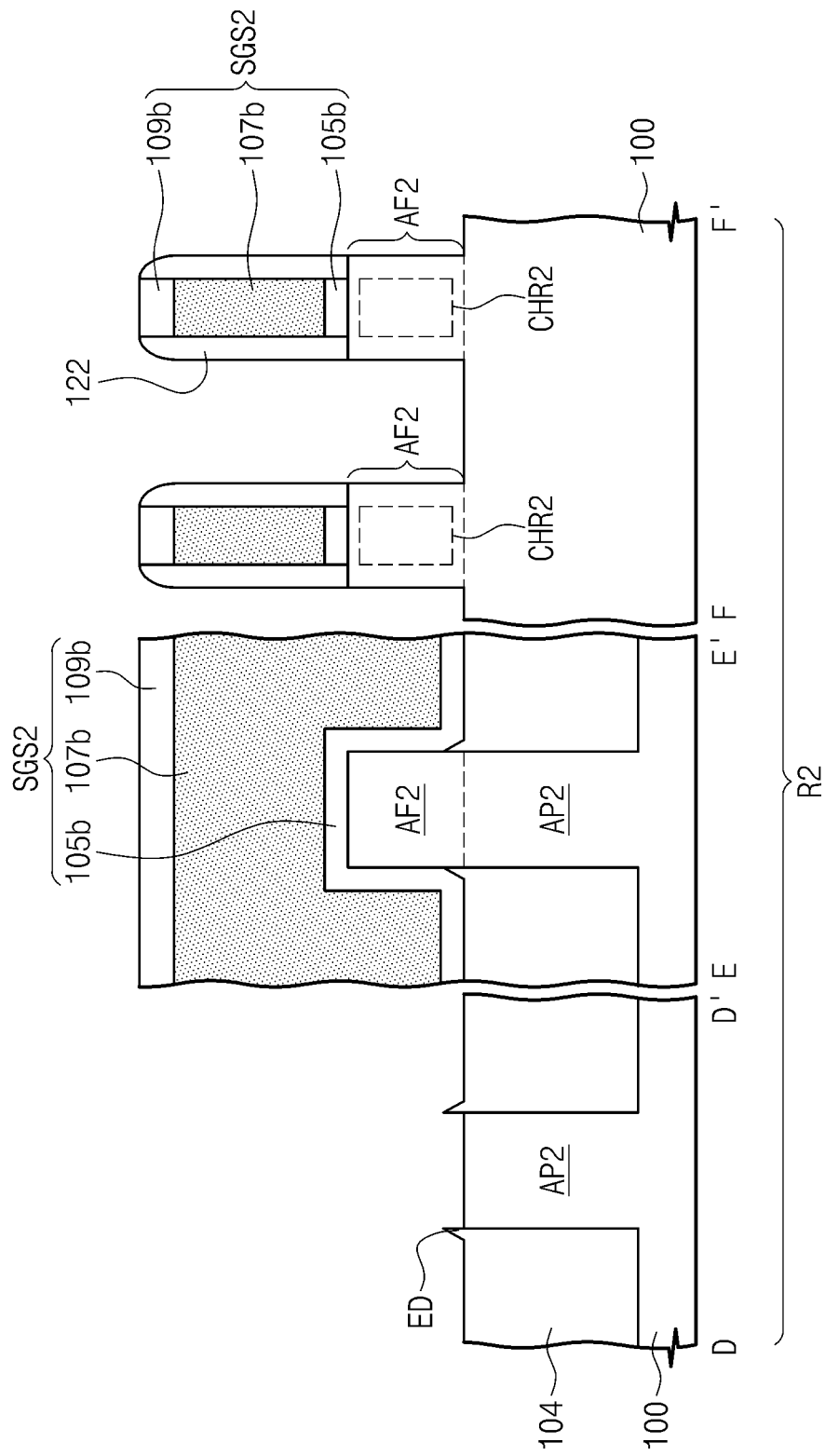

Referring to FIGS. 4A to 4C, a gate spacer layer 118 may be formed on the entire surface of the substrate 100. The gate spacer layer 118 may cover the first and second active patterns AP1 and AP2 and the first and second sacrificial gate structures SGS1 and SGS2. The gate spacer layer 118 may include, for example, silicon nitride. The gate spacer layer 118 may be formed by performing, for example, a chemical vapor deposition (CVD) process.

After the gate spacer layer 118 is formed, a first mask pattern M1 may be formed on the substrate 100 to expose the second region R2. The first mask pattern M1 may be, for example, a photoresist pattern. The first region R1 may be covered with the first mask pattern M1.

The gate spacer layer 118 in the second region R2 may be anisotropically etched using the first mask pattern M1 as an etch mask to form a second gate spacer 122 on both sidewalls of the second sacrificial gate structure SGS2. As a result, top surfaces of the second sacrificial regions SR2 of the second active fin AF2 and top surfaces of the second device isolation patterns 104 may be exposed. During the anisotropic etching, a portion of the second gate mask pattern 109b may be etched. After the anisotropic etching, the rest of the second gate mask pattern 109b may remain on the second sacrificial gate pattern 107b. Moreover, after the anisotropic etching, a portion of the gate spacer layer 118 may remain on both sidewalls of the second sacrificial regions SR2.

The second sacrificial regions SR2 of the second active fin AF2 may be removed. The removal of the second sacrificial regions SR2 may be performed using a dry or wet etch process. According to some embodiments, the remaining portion of the gate spacer layer 118 on both the sidewalls of the second sacrificial regions SR2 may be removed during the etch process.

More specifically, the removal of the second sacrificial regions SR2 may include etching the second sacrificial regions SR2 using an etch condition having a relatively low etch selectivity with respect to the gate spacer layer 118. As such, during the etch process to remove the second sacrificial regions SR2, an etch rate of the gate spacer layer 118 may be relatively fast. A portion of the second gate spacer 122 and a portion of the second gate mask pattern 109b may be etched by the etch process. After the etch process, the rest of the second gate spacer 122 may remain on both sidewalls of the second sacrificial gate structure SGS2 and the rest of the second gate mask pattern 109b may remain on the second sacrificial gate pattern 107b. According to some embodiments, after the etch process , the edge portions ED of the second device isolation patterns 104 may remain at both sides of the second active pattern AP2.

Figure 5A:
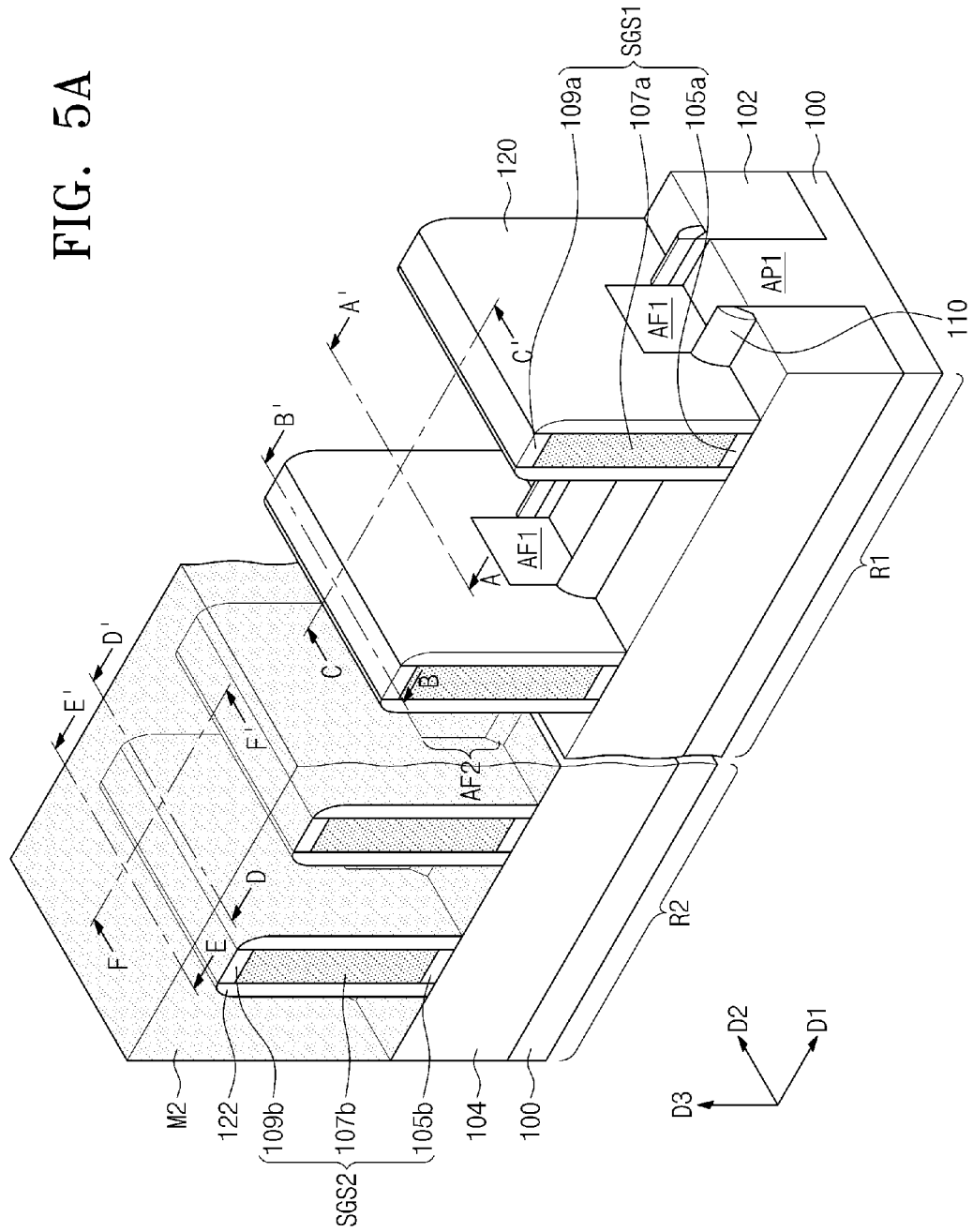
Figure 5B:
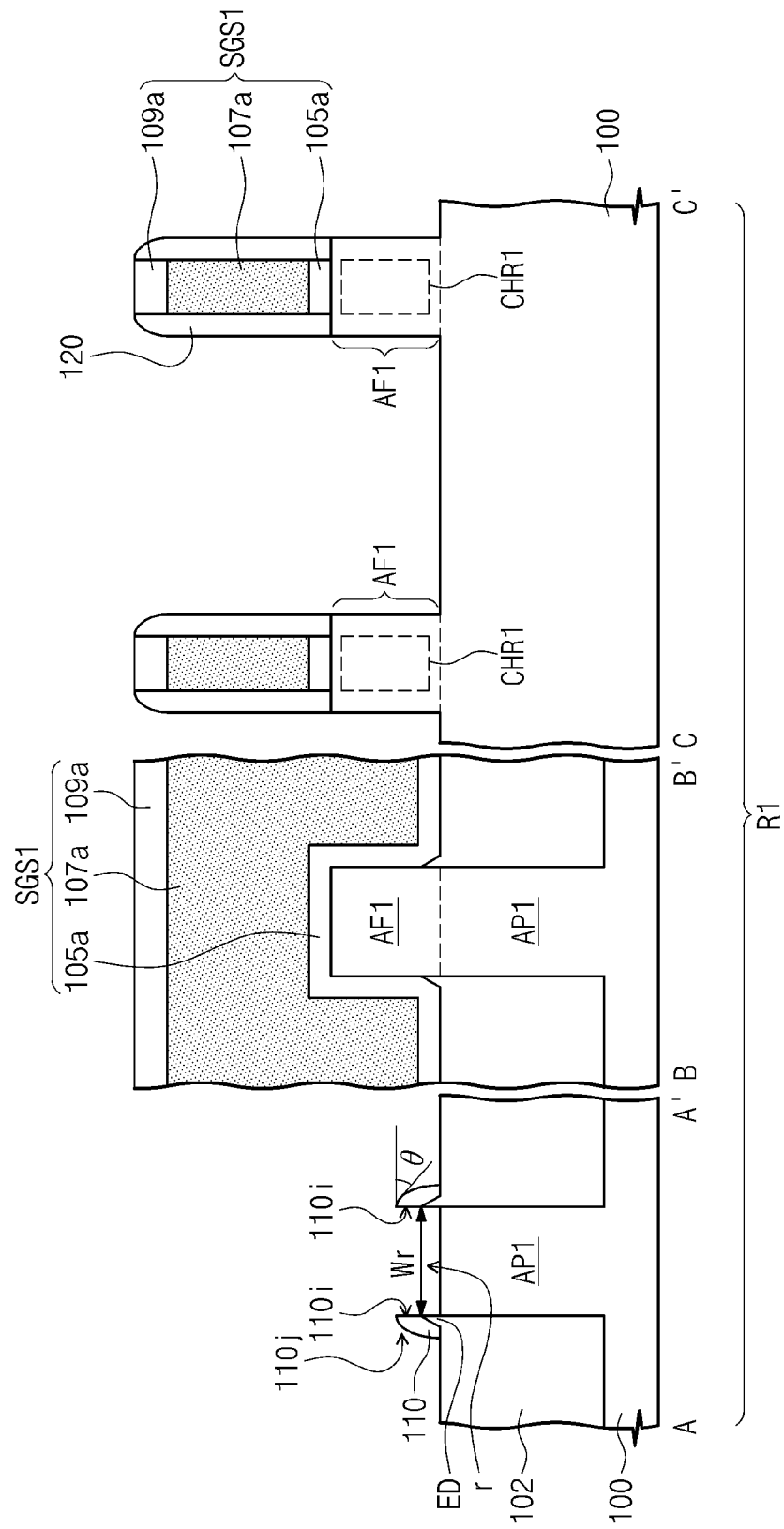
Figure 5C:
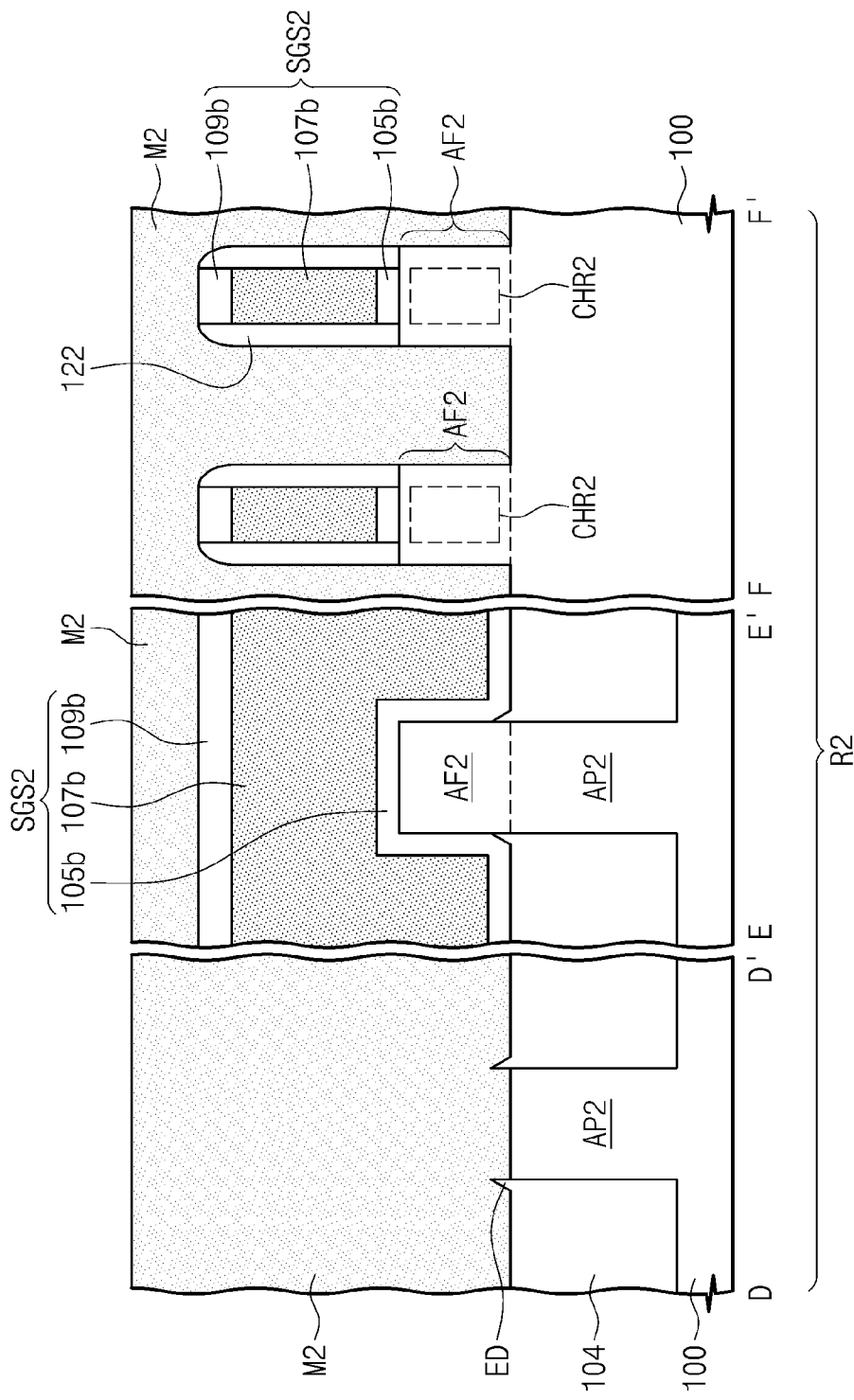

Referring to FIGS. 5A to 5C, the first mask pattern M1 may be removed. The first mask pattern M1 may be removed using an ashing and stripping process. After the removal of the first mask pattern M1, a second mask pattern M2 may be formed on the substrate 100 to expose the first region R1. The second mask pattern M2 may be, for example, a photoresist pattern. The second region R2 may be covered with the second mask pattern M2.

The gate spacer layer 118 in the first region R1 may be anisotropically etched using the second mask pattern M2 as an etch mask to form a first gate spacer 120 on both sidewalls of the first sacrificial gate structure SGS1. As a result, top surfaces of the first sacrificial regions SR1 of the first active fin AF1 and top surfaces of the first device isolation patterns 102 may be exposed. During the anisotropic etching, a portion of the first gate mask pattern 109a may be etched. After the anisotropic etching, the rest of the first gate mask pattern 109a may remain on the first sacrificial gate pattern 107a. Moreover, after the anisotropic etching, a portion of the gate spacer layer 118 may remain on both sidewalls of the first sacrificial regions SR1. According to some embodiments, the remaining portion of the gate spacer layer 118 on both the sidewalls of the first sacrificial regions SR1 may cover the edge portions ED of the first device isolation patterns 102.

The first sacrificial regions SR1 of the first active fin AF1 may be removed. The removal of the first sacrificial region SR1 may be performed using a dry or wet etch process. According to other embodiments, a portion of the gate spacer layer 118 remaining on both the sidewalls of the first sacrificial regions SR1 may be removed during the etch process.

More specifically, the removal of the first sacrificial regions SR1 may include etching the first sacrificial regions SR1 using an etch condition having a relatively high etch selectivity with respect to the gate spacer layer 118. For example, during the etch process to remove the first sacrificial regions SR1, an etch rate of the gate spacer layer 118 may be relatively slow. Thus, after the etch process, a remaining portion of the gate spacer layer 118 may remain on the first device isolation patterns 102. The remaining portion of the gate spacer layer 118, which is not etched by the etch process, is defined as auxiliary spacers 110. According to some embodiments, after the etch process, the edge portions ED of the first device isolation patterns 102 may be covered with the auxiliary spacers 110 and thus remain on both sides of the first active pattern AP1. A portion of the first gate spacer 120 and a portion of the first gate mask pattern 109a may be removed by the etch process. After the etch process, the rest of the first gate spacer 120 may remain on both the sidewalls of the first sacrificial gate structure SGS1 and the rest of the first gate mask pattern 109a may remain on the first sacrificial gate pattern 107a.

The auxiliary spacers 110 may be formed on the first device isolation patterns 102 at opposite sides of the first sacrificial gate structure SGS1, respectively. A pair of the auxiliary spacers 110 disposed at any one side of the first sacrificial gate structure SGS1 may be spaced apart from each other with the first active pattern AP1 interposed therebetween. Each of the auxiliary spacers 110 may extend along a boundary between the first active pattern AP1 and each of the first device isolation patterns 102 to be in contact with the first gate spacer 120. The auxiliary spacers 110 may include the same material as the first gate spacer 120. The auxiliary spacers 110 may include, for example, silicon nitride.

Each of the auxiliary spacers 110 may be formed to protrude from a top surface of each of the first device isolation patterns 102 in a third direction D3 perpendicular to both the first direction D1 and the second direction D2. Thus, the auxiliary spacers 110 may define groove regions "r" on the first active pattern AP1 at opposite sides of the first sacrificial gate structure SGS1.

More specifically, each of the auxiliary spacers 110 may include a first sidewall 110i and a second side wall 110j opposite to the first sidewall 110i. The first sidewalls 110i of the auxiliary spacers 110 may face each other with the first active pattern AP1 interposed therebetween. Each of the groove regions "r" is defined by a top surface of the first active pattern AP1 and the first sidewalls 110i of the auxiliary spacers 110 adjacent to each other with the first active pattern AP1 interposed therebetween.

Each of the groove regions "r" may have a width Wr which is a distance between the first sidewalls 110i that define each of the groove regions "r". The width Wr between the first sidewalls 110i may be substantially constant or may decrease as far away from the substrate 100 in the third direction D3

An upper portion of the second side wall 110j of each of the auxiliary spacers 110, may slant to the top surface of the substrate 100 at an angle θ. The angle θ is an angle between the top surface of the substrate 100 and a plane tangent to the upper portion of the second side wall 110j. The angle θ may be about 40 degrees to about 90 degrees. For example, the top surface of the substrate 100 may be an (100) plane of a crystal structure of the substrate 100.

Figure 6A:
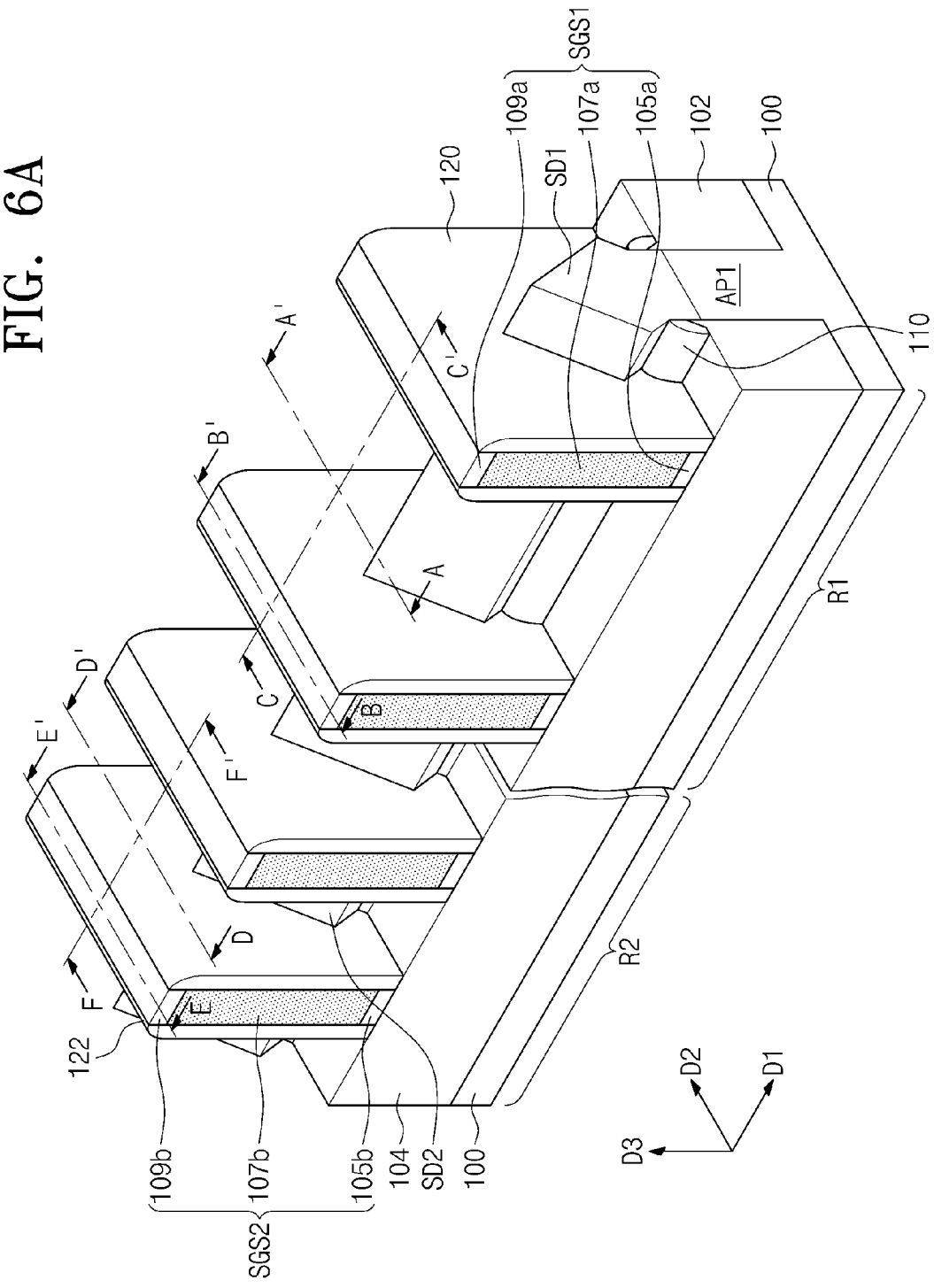
Figure 6B:
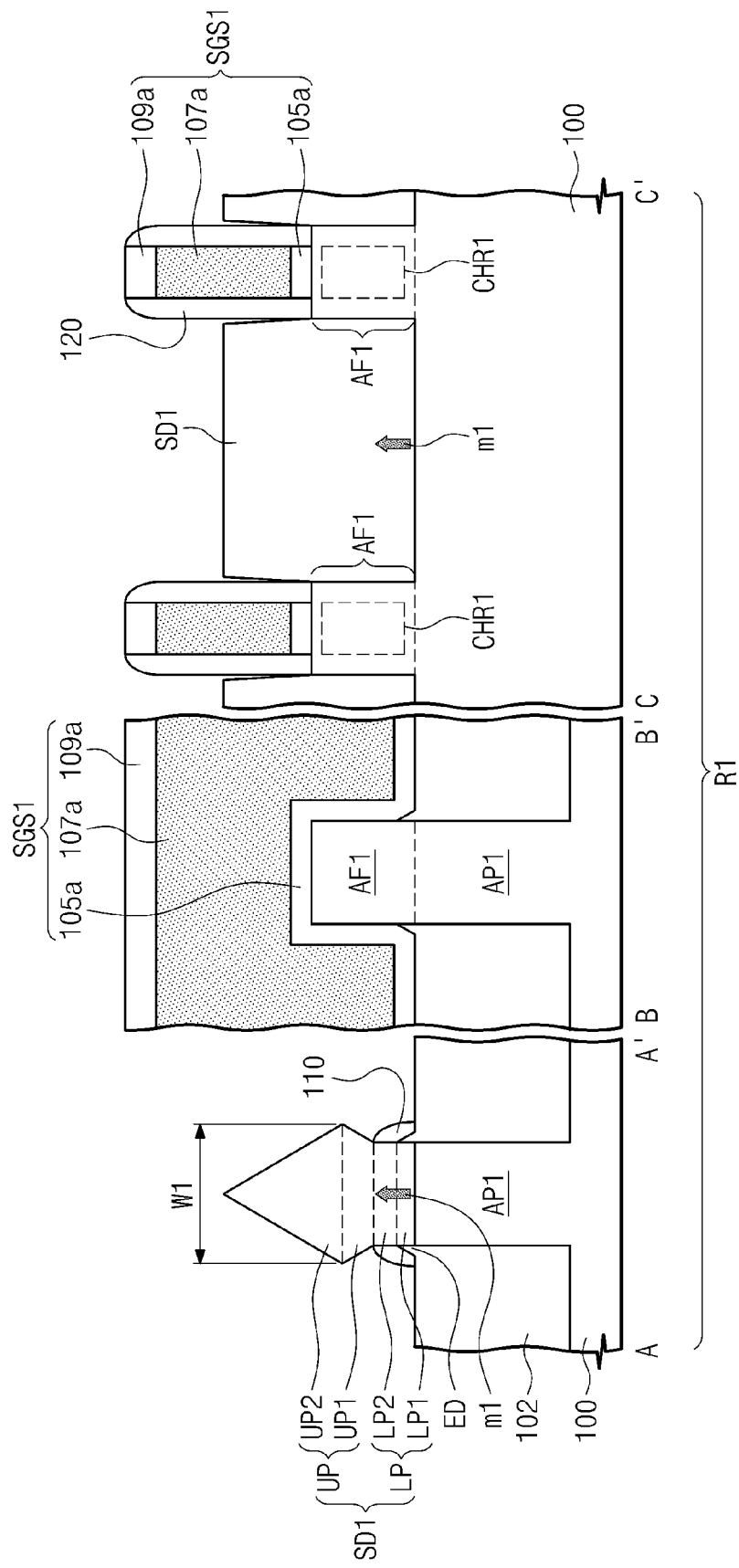
Figure 6C:
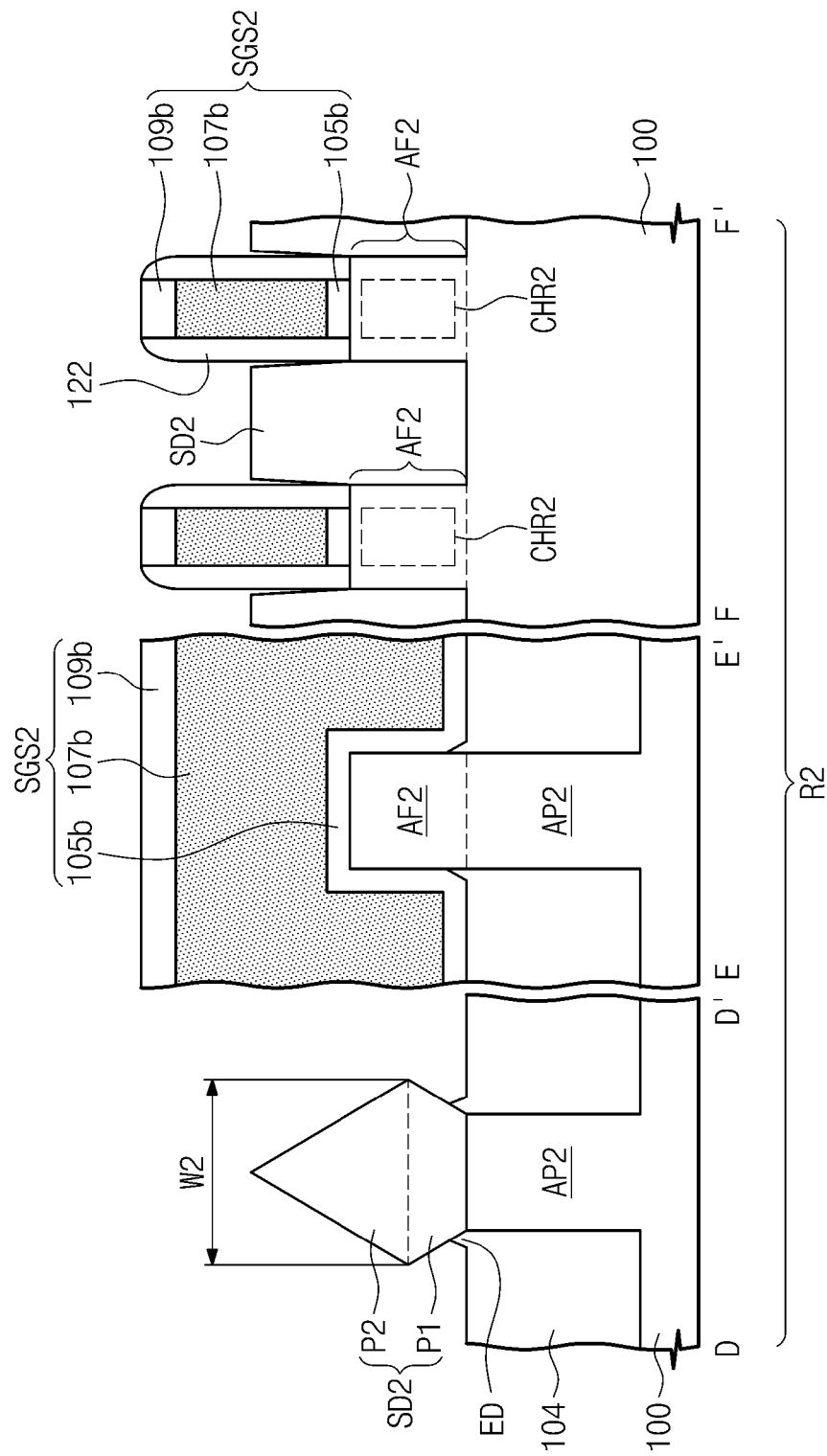

Referring to FIGS. 6A to 6C, the second mask pattern M2 may be removed. The second mask pattern M2 may be removed using an ashing and stripping process. After the removal of the second mask pattern M2, first source/drain regions SD1 may be formed at opposite sides of the first sacrificial gate structure SGS1 and second source/drain regions SD2 may be formed at opposite sides of the second sacrificial gate structure SGS2. The first and second source/drain regions SD1 and SD2 may be formed at the same time.

The formation of the first and second source/drain regions SD1 and SD2 may include performing a selective epitaxial growth process on the substrate 100. For example, each of the first source/drain regions SD1 may be an epitaxial pattern grown using a top surface of the first active pattern AP1 as a seed, and each of the second source/drain regions SD2 may be an epitaxial pattern grown using a top surface of the second active pattern AP2 as a seed. Each of the first and second source/drain regions SD1 and SD2 may include at least one of, for example, silicon germanium (SiGe), silicon (Si), and/or silicon carbide (SiC) epitaxially grown from the substrate 100. For example, when a semiconductor device is a CMOS structure, a first epitaxial layer for a source/drain of an NMOSFET and a second epitaxial layer for a source/drain of a PMOSFET may be formed. The first epitaxial layer may be configured to cause a tensile strain, and the second epitaxial layer may be configured to cause a compressive strain. Although the first epitaxial layer may be formed of silicon carbide (SiC) and the second epitaxial layer may be formed of silicon germanium (SiGe), the inventive concept is not limited thereto. Simultaneously with the epitaxial process or after the epitaxial process, the first and second source/drain regions SD1 and SD2 may be doped with impurities.

The first source/drain regions SD1 may be formed to fill the groove regions "r". Each of the first source/drain regions SD1 may include a lower portion LP covered with the auxiliary spacers 110 and an upper portion UP exposed by the auxiliary spacers 110. The lower portion LP may include a first lower portion LP1 in contact with the first active pattern AP1 and a second lower portion LP2 spaced apart from the first active pattern AP1 with the first lower portion LP1 interposed therebetween. The upper portion UP may include a first upper portion UP1 in contact with the lower portion LP and a second upper portion UP2 spaced apart from the lower portion LP with the first upper portion UP1 interposed therebetween. As the first source/drain regions SD1 is formed to fill the groove regions "r", the lower portion LP may have a width corresponding to the width Wr of each of the groove regions "r". According to some embodiments, as described with reference to FIG. 8A, the lower portion LP may have a substantially constant width as it extends away from the substrate 100. The first upper portion UP1 may have a width increasing as it extends away from the substrate 100, and the second upper portion UP2 may have a width decreasing as it extends away from the substrate 100. Each of the first source/drain regions SD1 may have a first maximum width W1 at a boundary between the first upper portion UP1 and the second upper portion UP2. According to another embodiments, as described with reference to FIG. 8B, the lower portion LP may have a width that substantially decreases as far away from the substrate. According to other embodiments, as described with reference to FIG. 8C, the first lower portion LP1 may have a width substantially increasing as it extends away from the substrate 100 and the second lower portion LP2 may have a width substantially decreasing as it extends away from the substrate 100.

Each of the second source/drain regions SD2 may include a first portion P1 adjacent to the substrate 100 and a second portion P2 relatively far from the substrate 100. As described with reference to FIG. 8D, the first portion P1 may have a width increasing as it extends away from the substrate 100 and the second portion P2 may have a width relatively decreasing as it extends away from the substrate 100. Each of the second source/drain regions SD2 may have second maximum width W2 at a boundary between the first portion P1 and the second portion P2. The second maximum width W2 may be greater than the first maximum width W1.

In general, the substrate 100 may include single-crystalline silicon. The first and second source/drain regions SD1 and SD2 may be formed by performing a selective epitaxial growth process using the substrate 100 as a seed. In this case, the first and second source/drain regions SD1 and SD2 may be grown along (100) and (110) planes of silicon-crystalline structure, and when sidewalls of the first and second source/drain regions SD1 and SD2 constitute a (111) plane of silicon-crystalline structure, the epitaxial growth of the first and second source/drain regions SD1 and SD2 may be completed.

After the etch process for removing the first and second sacrificial regions SR1 and SR2, a top surface of the first active pattern AP1 at opposite sides of the first sacrificial gate structure SGS1 and a top surface of the second active pattern AP2 at opposite sides of the second sacrificial gate structure SGS2 may not be planar or may be uneven. In addition, after the etch process, the edge portion ED of each of the first device isolation patterns 102 may be formed at the boundary between the first active pattern AP1 and each of the first device isolation patterns 102, and the edge portion ED of each of the second device isolation patterns 104 may be formed at the boundary between the second active pattern AP2 and each of the second device isolation patterns 104. The unevenness of top surfaces of the first and second active pattern AP1 and AP2 and the edge portions ED may have an influence on the growth of the first and second source/drain regions SD1 and SD2 using the top surfaces of the first and second active patterns AP1 and AP2 as seeds. In particular, when the top surface of the first active pattern AP1 is uneven and the edge portion ED of each of the first device isolation patterns 102 is formed in the first region R1 where the length of the first sacrificial regions SR1 is relatively great, the epitaxial growth of the first source/drain regions SD1 may be more suppressed.

More specifically, during a selective epitaxial process to form the first source/drain regions SD1, migration of particles constituting the first source/drain regions SD1 may be more difficult on oxide than on single-crystalline silicon. When the top surface of the first active pattern AP1 is uneven, the top surface of the first active pattern AP1 may be partially lower than a top surface of the first device isolation patterns 102 adjacent thereto. For example, the first device isolation patterns 102 may have sidewalls exposed by the first active pattern AP1 and the exposed sidewalls of the first device isolation patterns 102 may include oxide. Thus, vertical migration m1 of the particles on the exposed sidewalls of the first device isolation patterns 102 (i.e., migration of the particles in a direction perpendicular to the top surface of the substrate 100) may be suppressed during the selective epitaxial growth process. As such, growth of the (100) plane of the first source/drain regions SD1 may be suppressed to result in growth of the (111) plane of the first source/drain regions SD1. Moreover, the edge portion ED of each of the first device isolation patterns 102 may include oxide. Accordingly, vertical migration m1 of the particles on the edge portion ED (i.e., migration of the particles in a direction perpendicular to the top surface of the substrate 100) may be suppressed during the selected epitaxial growth process. As such, growth of the (100) plane of the first source/drain regions SD1 may be suppressed to result in growth of the (111) plane of the first source/drain regions SD1. Thus, it may be difficult to form the first source/drain regions SD1 to have required characteristics.

According to one embodiment of the inventive concept, the auxiliary spacers 110 may be formed only in the first region R1 where the lengths of the first sacrificial regions SR1 are relatively great. In addition, the auxiliary spacers 110 may include nitride. During the selective epitaxial process, the migration of the particles constituting the first source/drain regions SD1 may be easier on nitride than on the oxide.

In detail, the first source/drain regions SD1 may be formed to fill the groove regions "r" defined by the auxiliary spacers 110. In this case, during the selective epitaxial growth process to form the first source/drain regions SD1, vertical migration m1 of the particles may increase relatively on the first sidewalls 110$i$ of the auxiliary spacers 110. Thus, the (100) plane of the first source/drain regions SD1 may be easily grown and the first source/drain regions SD1 may be formed of a uniformly grown epitaxial layer. As a result, a semiconductor device with improved reliability and a method of manufacturing the same may be provided.

Moreover, as the upper portion of the second sidewall 110$j$ of each of the auxiliary spacers 110 slants to the top surface of the substrate 100 at the angle θ, horizontal migration of the particles constituting the first source/drain regions SD1 (i.e., migration of the particles in a direction parallel to the top surface of the substrate 100) may be suppressed during the selective epitaxial growth process to form the first source/drain regions SD1. Accordingly, the first source/drain regions SD1 may be formed to have the first maximum width W1 that is smaller than the second maximum width W2 of the second source/drain regions SD2. Thus, when the plurality of the first active patterns AP1 are provided, the first source/drain regions SD1 formed on the plurality of the first active patterns AP1, respectively, may be prevented from being connected to each other.

Figure 7A:
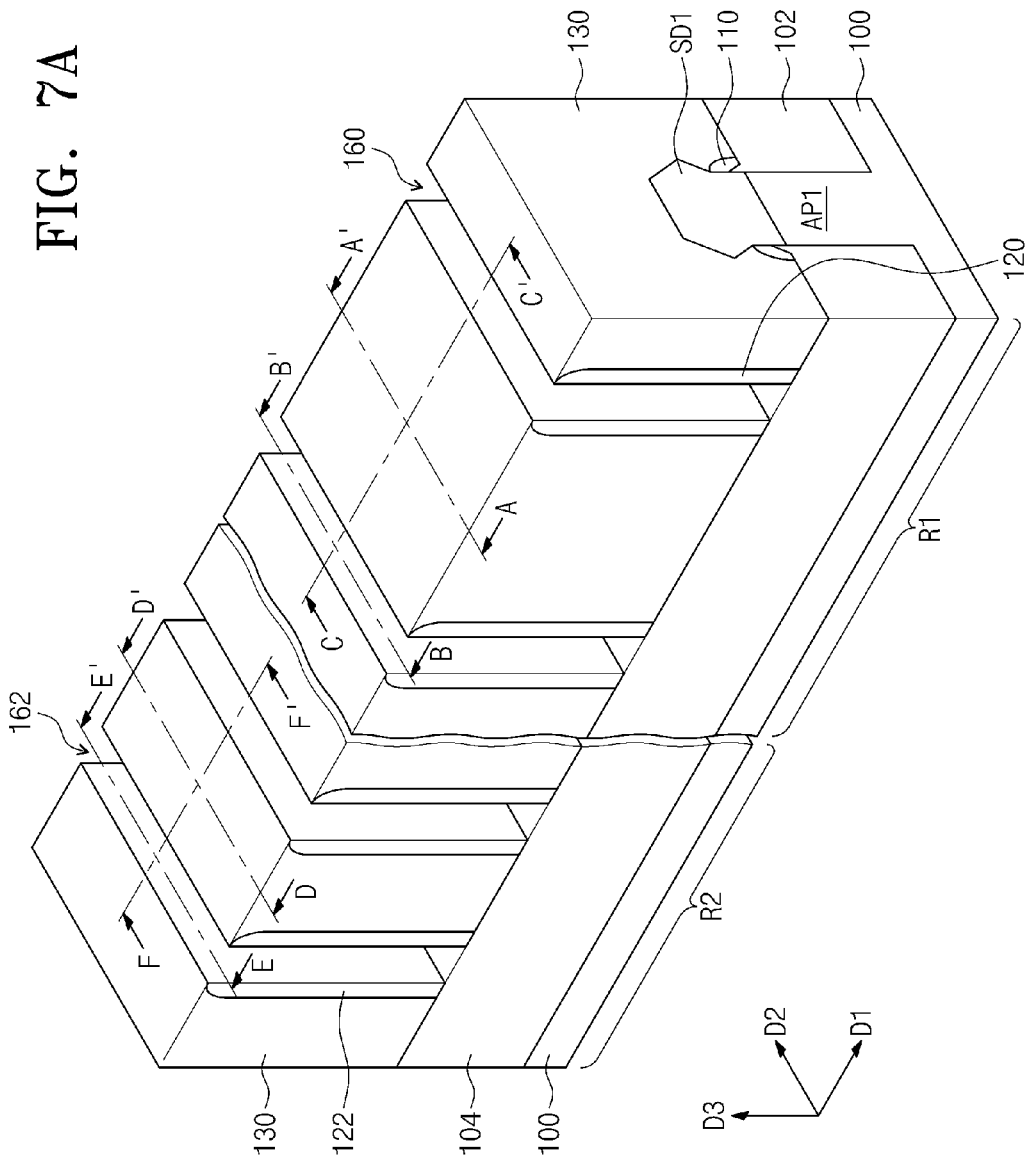
Figure 7B:
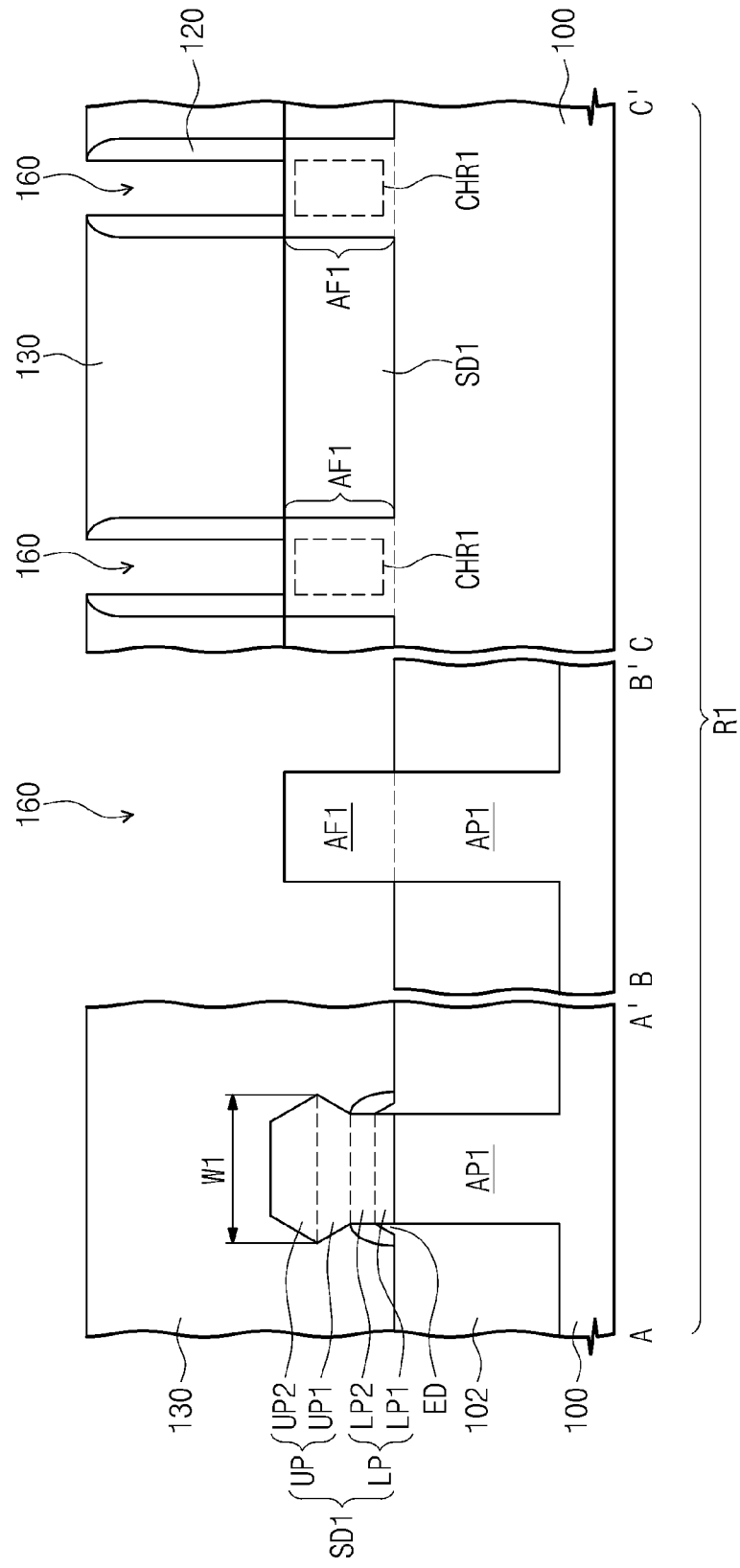
Figure 7C:
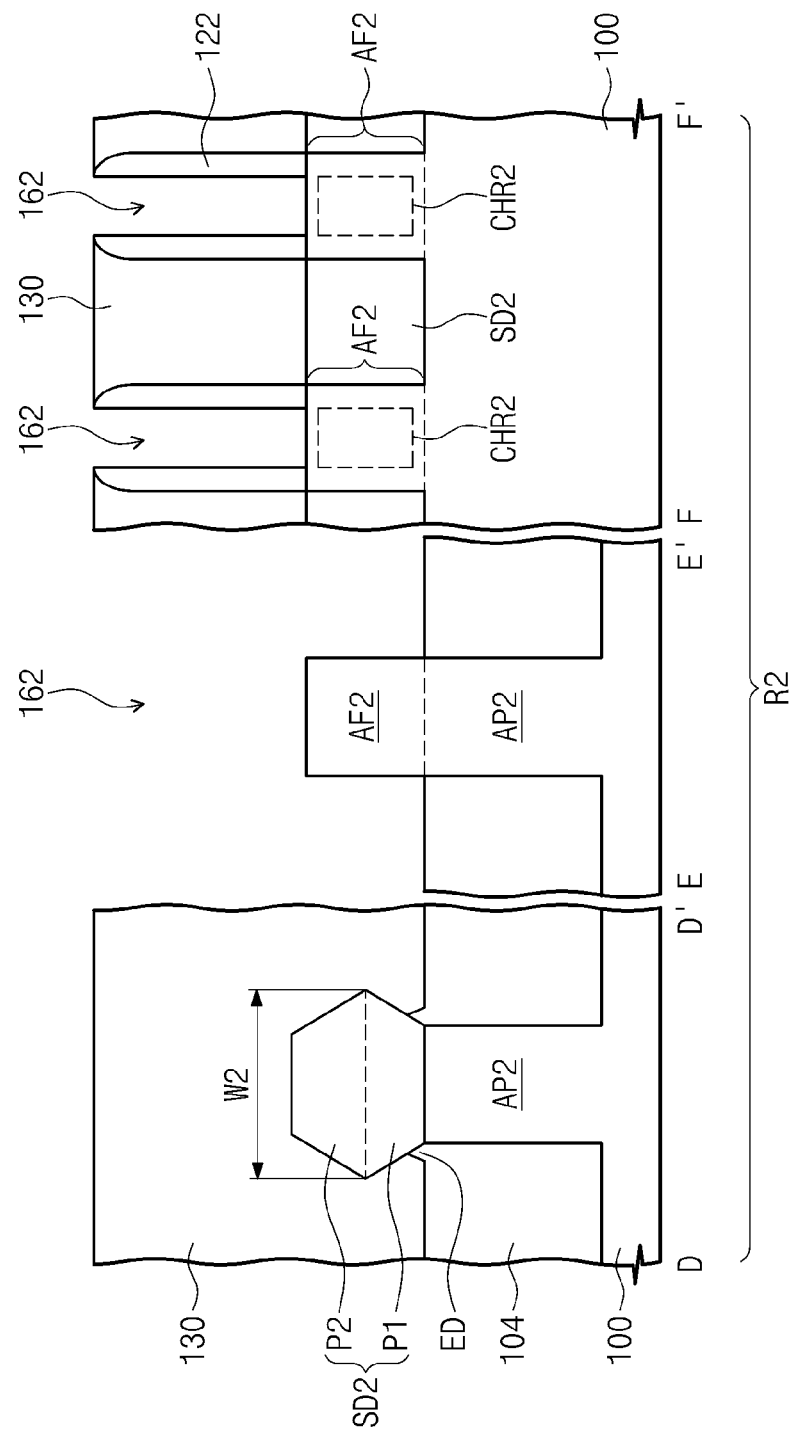

Referring to FIGS. 7A to 7C, upper portions of the first and second source/drain regions SD1 and SD2 may be partially etched. Thus, each of the first and second source/drain regions SD1 and SD2 may have a top surface parallel to the top surface of the substrate 100. The top surface of each of the first and second source/drain regions SD1 and SD2 may be connected to a contact plug formed in a subsequent process.

A lower interlayer dielectric 130 may be formed on the substrate 100 where the first and second source/drain regions SD1 and SD2 are formed. The lower interlayer dielectric 130 may be formed to cover the first and second source/drain regions SD1 and SD2 and the first and second sacrificial gate structures SGS1 and SGS2. The lower interlayer dielectric 130 may include at least one of silicon oxide, silicon nitride, silicon oxynitride, and/or low-k dielectric.

The lower interlayer dielectric 130 may be etched to expose the top surfaces of the first and second sacrificial gate patterns 107a and 107b. The first and second gate mask patterns 109a and 109b may be removed during the etch process of the lower interlayer dielectric 130. Then, the first and second sacrificial gate patterns 107a and 107b may be removed. Thus, a first gap region 160 may be formed to expose the first channel region CHR1 of the first active fin AF1 between the first gate spacers 120 and a second gap region 162 may be formed to expose the second channel region CHR2 of the second active fin AF2 between the second gate spacers 122. The formation of the first and second gap regions 160 and 162 may include performing an etch process having an etch selectivity with respect to the first and second gate spacers 120 and 122, the lower interlayer dielectric 130, and the first and second etch-stop patterns 105a and 105b to etch the first and second sacrificial gate patterns 107a and 107b. The formation of the first gap region 160 may include removing the first etch-stop pattern 105a to expose the first channel region CHR1 of the first active fin AF1, and the formation of the second gap region 162 may include removing the second etch-stop pattern 105b to expose the second channel region CHR2 of the second active fin AF2. According to some embodiments, the edge portions ED exposed by the first and second gap regions 160 and 162 may also be removed during the formation of the first and second gap regions 160 and 162.

Returning to FIGS. 1A to 1C, a first gat dielectric pattern 140 and a first gate electrode 150 may be formed to fill the first gap region 160. In addition, a second gate dielectric pattern 142 and a second gate electrode 152 may be formed to fill the second gap region 162.

More specifically, a gate dielectric layer (not shown) may be formed on the substrate 100 including the first and second gap regions 160 and 162 to fill a portion of each of the first and second gap regions 160 and 162. The gate dielectric layer may be formed to cover the first and second channel regions CHR1 and CHR2. The gate dielectric layer may include at least one high-k dielectric. The gate dielectric layer may include at least one of, for example, hafnium oxide, hafnium silicate, zirconium oxide, and/or zirconium silicate, but the material of the gate dielectric layer is not limited thereto. The gate dielectric layer may be formed by performing, for example, an atomic layer deposition (ALD) process. A gate layer (not shown) may be formed on the gate dielectric layer to fill a remaining portion of each of the first and second gap regions 160 and 162. The gate layer may include at least one of conductive metal nitride (e.g., titanium nitride, tantalum nitride, etc.) and a metal (e.g., aluminum, tungsten, etc.).

The gate dielectric layer and the gate layer stacked sequentially may be planarized to form the first gate dielectric pattern 140, the second gate dielectric pattern 142, the first gate electrode 150, and the second gate electrode 152 at the same time. Due to the polarization, a top surface of the lower interlayer dielectric 130 and top surfaces of the first and second gate spacers 120 and 122 may be exposed. The first and second gate dielectric patterns 140 and 142 may extend along bottom surfaces of the first and second gate electrodes 150 and 152, respectively. The first gate dielectric pattern 140 may be disposed on both sidewalls of the first gate electrode 150 to be interposed between the first gate electrode 150 and the first gate spacer 120. The second gate dielectric pattern 142 may be disposed on both sidewalls of the second gate electrode 150 to be interposed between the second gate electrode 152 and the second gate spacer 122.

The first channel region CHR1 of the first active pattern AF1 disposed below the first gate electrode 150 may be interposed between the first source/drain regions SD1, and the second channel region CHR2 of the second active fin AF2 disposed below the second gate electrode 152 may be interposed between the second source/drain regions SD2. The first gate dielectric pattern 140, the first gate electrode 150, and the first gate spacer 120 are defined as a first gate structure GS1, and the second gate dielectric pattern 142, the second gate electrode 152, and the second gate spacer 122 are defined as a second gate structure GS2.

Although not shown, an upper interlayer dielectric may be formed on the substrate 100 including the first and second gate structures GS1 and GS2. A first contact hole and a second contact hole may be formed through the upper interlayer dielectric and the lower interlayer dielectric 130 to expose the first and second source/drain regions SD1 and SD2, respectively. Contact plugs may be formed to fill the first and second contact holes. Interconnections may be formed on the upper interlayer dielectric to be connected to the contact plugs. As a result, the interconnections are formed on the upper interlayer dielectric to be connected to the first and second source/drain regions SD1 and SD2 through the contact plugs, respectively.

According to one embodiment of the inventive concept, only in the first region R1 where the first distance d1 between the adjacent first gate structures GS1 is relatively great, the auxiliary spacers 110 may be disposed to cover lower portions LP of the first source/drain regions SD1, respectively. The auxiliary spacers 110 may include nitride. In this case, during the selective epitaxial growth process to form the first source/drain regions SD1, vertical migration m1 of the particles constituting the first source/drain regions SD1 may relatively increase on the first sidewalls 110i of the auxiliary spacers 110. That is, growth of the (100) plane of the first source/drain regions SD1 may be easy. Accordingly, the first source/drain regions SD1 may be formed of a uniformly grown epitaxial layer. As a result, a semiconductor device with superior reliability and a method of manufacturing the same may be provided.

Figure 10:
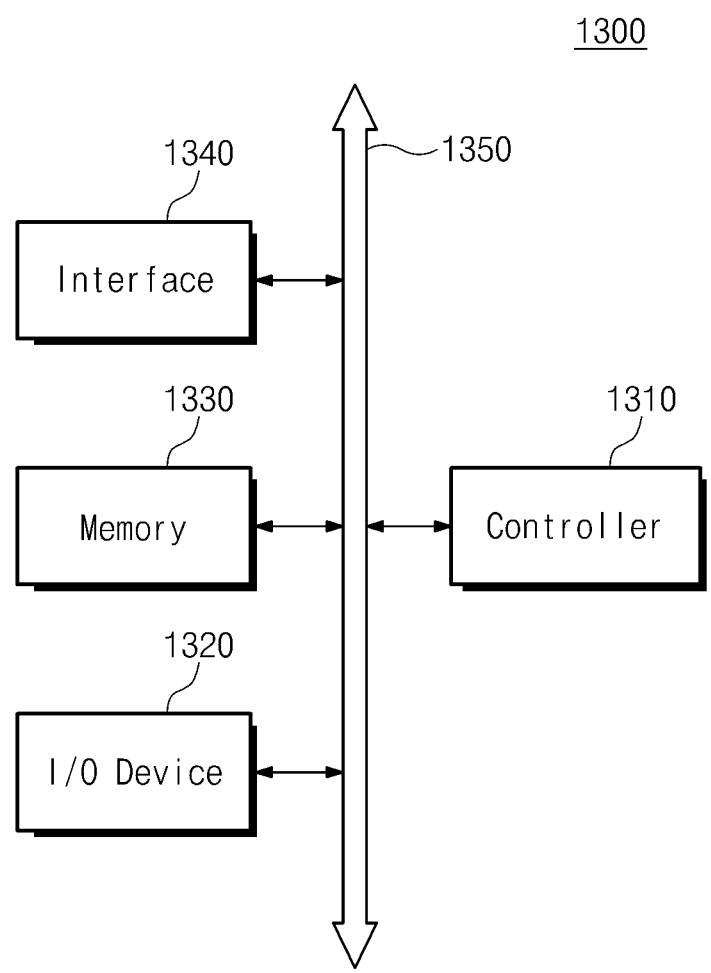
FIG. 10 schematically illustrates an electronic device including a semiconductor device according to embodiments of the inventive concept.

FIG. 10 schematically illustrates an electronic device 1300 including a semiconductor device according to embodiments of the inventive concept. As illustrated, the electronic device 1300 may be one of a personal digital assistant (PDA), a laptop computer, a portable computer, a web tablet, a wireless phone, a mobile phone, a digital music player, a wired/wireless electronic device, and a complex electronic device having at least two thereof. The electronic device 1300 may include a controller 1310, an input/output (I/O) unit 1320 such as a keypad, keyboard and a display, a memory 1330, and a interface 1340, which are connected to each other through a bus 1350. The controller 1310 may include, for example, one or more microprocessors, a digital signal processor, a microcontroller or the like. The memory 1330, for example, may be used to store a command executed by the controller 1310. The memory 1330 may be used to store user data. The controller 1350 and/or the memory 1330 include the semiconductor device according to embodiments of the inventive concept. The electronic device 1300 may use a interface 1340 to transmit data to a wireless communication network performing communication using an RF signal or receive data from a network. For example, the wireless interface 1340 may include an antenna, a wireless transceiver, or the like. The electronic device 1300 may be used in a communication interface protocol such as third generation communication system (e.g., CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.).

In the foregoing embodiments, improved semiconductor devices may include a semiconductor chip formed from a wafer, a stack of semiconductor chips, a semiconductor package including a package substrate and one or more semiconductor chips stacked thereon, or a package-on-package device. For example, semiconductor devices according to embodiments of the inventive concept may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

A package, on which a semiconductor device according to embodiments of the inventive concept is mounted, may further include a controller configured to control the semiconductor device and/or a logic element.

As described in various of the above embodiments, only in a first region where a first distance between adjacent first gate structures is relatively great, auxiliary spaces may be disposed to cover lower portions of first source/drain regions, respectively. In this case, during a selective epitaxial growth process to form the first source/drain regions, vertical migration of particles constituting the first source/drain regions may relatively increase on first sidewalls of the auxiliary spacers. For example, growth of a (100) plane of the first source/drain regions may be easy. Thus, the first source/drain regions may be formed of a uniformly grown epitaxial layer. As a result, a semiconductor device with superior reliability and a method of manufacturing the same may be provided.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A semiconductor device comprising:
a substrate including a first region and a second region different from the first region;
a first active pattern protruding upwardly from the substrate in the first region and a second active pattern protruding upwardly from the substrate in the second region;
first gate structures crossing over the first active pattern and being spaced apart from each other by a first distance and second gate structures crossing over the second active pattern and being spaced apart from each other by a second distance;
a first source/drain region disposed on the first active pattern between the first gate structures; and
a second source/drain region disposed on the second active pattern between the second gate structures,
wherein the first source/drain region includes a lower portion in contact with the first active pattern and an upper portion in contact with the lower portion and spaced apart from the first active pattern, the upper portion including a first upper portion having a width substantially increasing as it extends away from the substrate and a second upper portion having a width substantially decreasing as it extends away from the substrate, and
wherein the second source/drain region includes a first portion in contact with the second active pattern and having a width substantially increasing as it extends away from the substrate, and a second portion in contact with the first portion, spaced apart from the second active pattern, and having a width substantially decreasing as it extends away from the substrate.

2. The semiconductor device of claim 1, wherein the first distance is greater than the second distance.

3. The semiconductor device of claim 1, wherein the first active pattern extends in a first direction and the first gate structures extend in a second direction intersecting the first direction,
wherein the first source/drain region has a width in the second direction, and
wherein the lower portion of the first source/drain region has a substantially constant width as it extends away from the substrate in a third direction intersecting both the first direction and the second direction.

4. The semiconductor device of claim 1, wherein the first active pattern extends in a first direction and the first gate structures extend in a second direction intersecting the first direction,
wherein the first source/drain region has a width in the second direction, and
wherein the lower portion of the first source/drain region has a width substantially decreasing as it extends away from the substrate in a third direction intersecting both the first direction and the second direction.

5. The semiconductor device of claim 1, wherein the first active pattern extends in a first direction and the first gate structures extend in a second direction intersecting the first direction,
wherein the first source/drain region has a width in the second direction, and
wherein the lower portion of the first source/drain region includes:
a first lower portion having a width substantially increasing as it extends away from the substrate in a third direction perpendicular to both the first direction and the second direction; and
a second lower portion having a width substantially decreasing as it extends away from the substrate in the third direction, and
wherein the first lower portion is provided between the first active pattern and the second lower portion.

6. The semiconductor device of claim 1, further comprising:
auxiliary spacers provided in the first region and disposed to cover the lower portion of the first source/drain region,
wherein the upper portion of the first source/drain region is exposed by the auxiliary spacers.

7. The semiconductor device of claim 6, further comprising:
first device isolation patterns disposed at opposite sides of the first active pattern,
wherein the auxiliary spacers are disposed on the first device isolation patterns and are spaced apart from each other with the first active pattern interposed therebetween.

8. The semiconductor device of claim 6, wherein each of the first gate structures comprises:
a first gate electrode crossing over the first active pattern; and
a first gate spacer on both sidewalls of the first gate electrode,
wherein the first active pattern extends in a first direction and the first gate electrode extends in a second direction intersecting the first direction, and
wherein each of the auxiliary spacers extends in the first direction to be in contact with the first gate spacer.

9. The semiconductor device of claim 8, wherein the auxiliary spacers include silicon nitride.

10. The semiconductor device of claim 1, wherein the first source/drain region has a first maximum width at a boundary between the first upper portion and the second upper portion,
wherein the second source/drain region has a second maximum width at a boundary between the first portion and the second portion, and
wherein the first maximum width is smaller than the second maximum width.

11. The semiconductor device of claim 1, wherein at least one of the first and second source/drain regions comprises:
a first epitaxial layer in contact with the substrate;
a second epitaxial layer on the first epitaxial layer; and
a third epitaxial layer on the second epitaxial layer,
wherein each of the first and second epitaxial layers includes germanium and a germanium concentration of the first epitaxial layer is lower than that of the second epitaxial layer.

12. A semiconductor device comprising:
a substrate including a first region and a second region;
a first active pattern protruding upwardly from the substrate in the first region and a second active pattern upwardly protruding from the substrate in the second region;
first gate structures crossing over the first active pattern and being spaced apart from each other by a first distance and second gate structures crossing over the second active pattern and being spaced apart from each other by a second distance;

a first source/drain region disposed on the first active pattern between the first gate structures;

a second source/drain region disposed on the second active pattern between the second gate structures; and auxiliary spacers disposed only in the first region, provided to be spaced apart from each other in a direction parallel to a direction in which the first gate structures cross over the first active pattern, and covering a lower portion of the first source/drain region.

13. The semiconductor device of claim 12, further comprising:

first device isolation patterns disposed at opposite sides of the first active pattern, wherein the auxiliary spacers are disposed on the first device isolation patterns and are spaced apart from each other with the first active pattern interposed therebetween.

14. The semiconductor device of claim 12, wherein each of the first gate structures comprises:

a first gate electrode crossing over the first active pattern; and a first gate spacer on both sidewalls of the first gate electrode, wherein the auxiliary spacers are connected to the first gate spacer.

15. The semiconductor device of claim 12, wherein the first source/drain region includes an upper portion exposed by the auxiliary spacers.

16. The semiconductor device of claim 12, wherein the first source/drain region comprises:

the lower portion being in contact with the first active pattern and having a substantially positively sloped sidewall; and an upper portion including a first upper portion being connected to the lower portion and having a substantially negatively sloped sidewall and a second upper portion being connected to the first upper portion and having a substantially positively sloped sidewall, and wherein the second source/drain region comprises:

a first portion being in contract with the second active pattern and having a substantially negatively sloped sidewall; and a second portion being connected to the first portion and having a substantially positively sloped sidewall.

17. The semiconductor device of claim 12, wherein the lower portion of the first source/drain region comprises:

a first lower portion being in contact with the first active pattern and having a substantially negatively sloped sidewall; and a second lower portion being connected to the first lower portion and having a substantially positively sloped sidewall.

18. The semiconductor device of claim 12, wherein the first distance is greater than the second distance.

19. A semiconductor device comprising:

a substrate including a first region and a second region;

a first active pattern provided to protrude upwardly from the substrate in the first region and a second active pattern provided to protrude upwardly from the substrate in the second region;

first gate structures crossing over the first active pattern and being disposed to be spaced apart from each other by a first distance and second gate structures crossing over the second active pattern and being spaced apart from each other by a second distance smaller than the first distance;

a first source/drain region disposed between the first gate structures;

a second source/drain region disposed between the second gate structures; and auxiliary spacers spaced apart from each other in a direction parallel to a direction in which the first gate structures extend, wherein the auxiliary spacers are disposed on sidewalls of a lower portion of the first source/drain region and are not disposed on sidewalls of a lower portion of the second source/drain region.

20. The semiconductor device of claim 19, further comprising:

first device isolation patterns disposed at opposite sides of the first active pattern, wherein the auxiliary spacers are disposed on the first device isolation pattern and are spaced apart from each other with the first active pattern interposed therebetween.

* * * * *